(12) United States Patent
Lee et al.

(10) Patent No.: US 12,356,841 B2
(45) Date of Patent: Jul. 8, 2025

(54) LIGHT-EMITTING DISPLAY DEVICE

(71) Applicant: LG Display Co., Ltd., Seoul (KR)

(72) Inventors: Booheung Lee, Gimpo-si (KR); KiSeob Shin, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/458,874

(22) Filed: Aug. 30, 2023

(65) Prior Publication Data

US 2024/0138240 A1  Apr. 25, 2024
US 2024/0237498 A9  Jul. 11, 2024

(30) Foreign Application Priority Data

Oct. 19, 2022  (KR) .................. 10-2022-0134901

(51) Int. Cl.
  *G09G 3/32*  (2016.01)
  *G09G 3/3233*  (2016.01)
  *H10K 59/131*  (2023.01)
  *H10K 59/80*  (2023.01)

(52) U.S. Cl.
  CPC ......... *H10K 59/879* (2023.02); *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/068* (2013.01); *G09G 2358/00* (2013.01); *G09G 2380/10* (2013.01)

(58) Field of Classification Search
  CPC .. H10K 59/879; H10K 59/131; G09G 3/3233; G09G 2300/0426; G09G 2300/0819; G09G 2300/0842; G09G 2300/0861; G09G 2310/08; G09G 2320/068; G09G 2358/00; G09G 2380/10
  See application file for complete search history.

(56) References Cited

U.S. PATENT DOCUMENTS

| | | | |
|---|---|---|---|
| 10,663,776 B1 * | 5/2020 | Hopkin | G02B 6/0031 |
| 11,054,701 B1 * | 7/2021 | Heber | G02B 6/0036 |
| 2015/0048333 A1 * | 2/2015 | Choi | H10K 50/858 257/40 |

(Continued)

FOREIGN PATENT DOCUMENTS

| | | |
|---|---|---|
| CN | 113302551 A | 8/2021 |
| CN | 114171556 A | 3/2022 |

(Continued)

*Primary Examiner* — Towfiq Elahi
(74) *Attorney, Agent, or Firm* — Seed IP Law Group LLP

(57) ABSTRACT

A display device includes a display panel in which a plurality of active areas including a first active area and a second active area is defined. The device includes a plurality of sub-pixels disposed in each of the plurality of active areas, and a gate driver disposed on the plurality of active areas. Each of the plurality of sub-pixels includes a first light-emitting diode (LED) that emits light in response to a driving current and a first lens that refracts the light emitted from the first LED and a second LED that emits light in response to the driving current and a second lens that refracts the light emitted from the second LED and has a different shape from the first lens. Accordingly, the device can operate in any one of a private mode and a share mode by using the first lens and the second lens.

25 Claims, 16 Drawing Sheets

(56) References Cited

U.S. PATENT DOCUMENTS

2022/0139335 A1    5/2022  Lee et al.
2023/0135035 A1*   5/2023  Yamauchi ............ H10K 59/353
                                                         257/40

FOREIGN PATENT DOCUMENTS

| EP | 4102573 A1 | 12/2022 | | |
|---|---|---|---|---|
| EP | 4207170 A1 | 7/2023 | | |
| EP | 4300472 A1 | 1/2024 | | |
| EP | 4354421 A1 | 4/2024 | | |
| JP | 2006-317941 A | 11/2006 | | |
| JP | 2007-328986 A | 12/2007 | | |
| JP | 2011-514538 A | 5/2011 | | |
| JP | 2022-080507 A | 5/2022 | | |
| JP | 2022068104 A | 5/2022 | | |
| KR | 20220059697 A | 5/2022 | | |
| TW | 202103261 A | 1/2021 | | |
| WO | 2009/104816 A1 | 8/2009 | | |
| WO | 2011/145174 A1 | 11/2011 | | |
| WO | WO-2021215201 A1 * | 10/2021 | ............ | G06V 10/14 |

* cited by examiner

LIGHT-EMITTING DISPLAY DEVICE

CROSS-REFERENCE TO RELATED APPLICATIONS

This application claims the priority of Korean Patent Application No. 10-2022-0134901 filed on Oct. 19, 2022, in the Korean Intellectual Property Office, the disclosure of which is incorporated herein by reference.

BACKGROUND

Technical Field

The present disclosure relates to a light-emitting display device, and more particularly, to a light-emitting display device whose viewing angle can be controlled.

Description of the Related Art

An organic light-emitting diode (OLED) serving as a self-emitting element includes an anode electrode, a cathode electrode and an organic compound layer formed between the anode electrode and the cathode electrode. The organic compound layer includes a hole transport layer (HTL), an emission layer (EML), and an electron transport layer (ETL). When a driving voltage is applied to the anode electrode and the cathode electrode, holes passing through the HTL and electrons passing through the ETL move to the EML and form excitons. As a result, the EML generates visible light. An active matrix light-emitting display device includes OLEDs capable of emitting light by itself and has advantages of fast response time, high emission efficiency, high luminance, and wide viewing angle. Thus, the active matrix light-emitting display device has been used in various fields.

In the light-emitting display device, pixels each including the OLED are arranged in a matrix form and the luminance of the pixels is adjusted depending on a gray scale of video data.

BRIEF SUMMARY

Generally, a light-emitting display device is not limited in viewing angle, but it is beneficial to have a limited viewing angle for reasons of privacy protection, information protection, and the like.

Further, when the light-emitting display device is used to provide vehicle driving information, an image displayed by the light-emitting display device may be reflected from a window of a vehicle and thus may block a driver's view. Such reflection of the image in the vehicle is particularly severe during driving at night and may adversely affect the driver's safe driving. Therefore, a light-emitting display device to be applied to a vehicle is required to have a limited viewing angle.

Meanwhile, such limitation of viewing angle varies depending on whether a vehicle is driven and whether a driver and a passenger are viewing. Therefore, a viewing angle needs to be selectively switched.

Moreover, in some countries, exposure of multimedia played back in front of a passenger seat to a driver is prohibited. Therefore, a viewing angle needs to be selectively switched.

One or more embodiments of the present disclosure provide a light-emitting display device in which each of a plurality of active areas of a display panel can selectively limit a viewing angle.

One or more embodiments of the present disclosure provide a light-emitting display device in which each of a plurality of active areas can operate independently in a private mode or a share mode.

Yet further embodiments of the present disclosure provide a light-emitting display device with a reduced bezel.

Other embodiments of the present disclosure provide a light-emitting display device in which a delay occurring during a transfer of a signal output from a gate driver to a signal line can be suppressed.

Technical benefits of the present disclosure are not limited to the above-mentioned benefits, and other benefits, which are not mentioned above, can be clearly understood by those skilled in the art from the following descriptions.

According to an aspect of the present disclosure, the light-emitting display device includes a display panel in which a plurality of active areas including a first active area and a second active area is defined. Also, the light-emitting display device includes a plurality of sub-pixels disposed in each of the plurality of active areas, and a gate driver disposed on the plurality of active areas. Each of the plurality of sub-pixels includes a first light-emitting diode (LED) that emits light in response to a driving current and a first lens that refracts the light emitted from the first LED. Also, each of the plurality of sub-pixels includes a second LED that emits light in response to the driving current and a second lens that refracts the light emitted from the second LED and has a different shape from the first lens. Therefore, according to the present disclosure, the light-emitting display device can operate in any one of a private mode and a share mode by using the first lens and the second lens.

According to another aspect of the present disclosure, the light-emitting display device includes a display panel in which an active area including a first active area and a second active area is defined. Also, the light-emitting display device includes a plurality of sub-pixels disposed in each of the first active area and the second active area, and a gate driver disposed on the first active area and the second active area. Each of the plurality of sub-pixels includes a first LED that emits light in response to a driving current in a private mode. Also, each of the plurality of sub-pixels includes a half-spherical lens that refracts the light emitted from the first LED and limits a viewing angle in a first direction and a second direction. Further, each of the plurality of sub-pixels includes a second LED that emits light in response to the driving current in a share mode. Furthermore, each of the plurality of sub-pixels includes a half-cylindrical lens that refracts light emitted from the second LED and limits the viewing angle only in the first direction. Therefore, according to the present disclosure, each of the first active area and the second active area can operate independently in any one of the private mode and the share mode.

Other detailed matters of the exemplary embodiments are included in the detailed description and the drawings.

According to the present disclosure, each of a plurality of active areas can operate independently in a private mode or a share mode.

According to the present disclosure, a viewing angle can be limited selectively in each of the plurality of active areas.

According to the present disclosure, a delay occurring during a transfer of a signal output from a gate driver to a signal line can be suppressed.

According to the present disclosure, the gate driver is disposed on the active area, and, thus, a bezel can be minimized.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
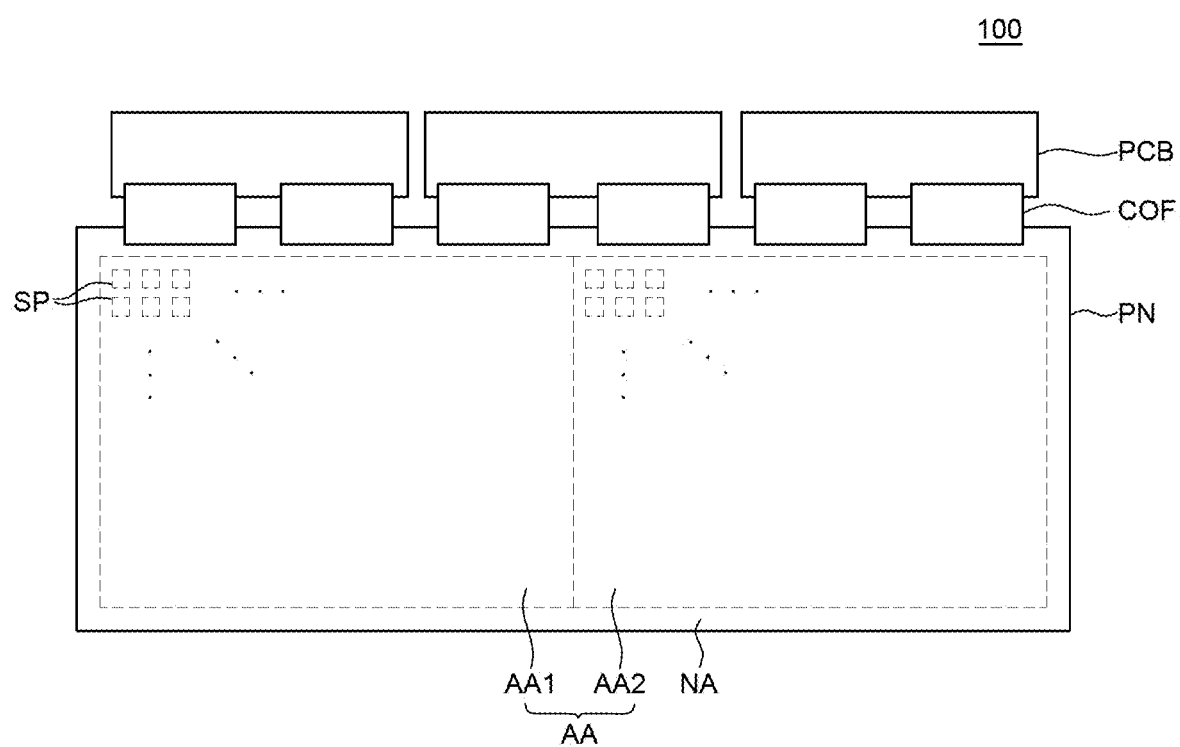
FIG. 1 is a schematic plan view of a light-emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a light-emitting display device according to an exemplary embodiment of the present disclosure. For the convenience of description, FIG. 1 illustrates only a display panel PN, a plurality of flexible films COF, and a plurality of printed circuit boards PCB among various components of a light-emitting display device 100.

Referring to FIG. 1, the light-emitting display device 100 according to an exemplary embodiment of the present disclosure includes the display panel PN, the plurality of flexible films COF, and the plurality of printed circuit boards PCB.

The display panel PN is configured to display an image to a user. An LED for displaying an image, a pixel circuit for driving the LED, a signal line for transferring various signals to the LED and the pixel circuit, and the like may be disposed in the display panel PN.

The display panel PN includes an active area AA and a non-active area NA.

The active area AA is an area that displays an image in the display panel PN. A plurality of sub-pixels SP constituting a plurality of pixels and a circuit for driving the plurality of sub-pixels SP may be disposed in the active area AA. The plurality of sub-pixels SP is a minimum unit constituting the active area AA. A plurality of scan signal lines and a plurality of data lines intersect each other in the plurality of sub-pixels SP. Each of the plurality of sub-pixels SP may be connected to a scan signal line and a data line.

The active area AA includes a first active area AA1 and a second active area AA2. The first active area AA1 and the second active area AA2 operate independently of each other. Each of the first active area AA1 and the second active area AA2 may operate in any one of a share mode and a private mode in left and right directions. The first active area AA1 and the second active area AA2 are configured to operate in either the same mode or in different modes. In the private mode, a viewing angle is narrow in the left and right directions, and, thus, only some of a plurality of viewers can view an image. In the share mode, the viewing angle is wide in the left and right directions, and, thus, more viewers can view the image. The private mode and the share mode will be described in more detail with reference to FIG. 4A through FIG. 6.

The non-active area NA is an area that does not display an image. Various signal lines and circuits for driving the LEDs in the active area AA are disposed in the non-active area NA. For example, link lines for transferring a signal to the plurality of sub-pixels SP and circuits in the active area AA may be disposed in the non-active area NA, but the present disclosure is not limited thereto.

Although not illustrated in the drawing, a gate driver is disposed in the display panel PN. For example, the gate driver may be disposed on each of the first active area AA1 and the second active area AA2 of the display panel PN in a gate in active area (GIA) fashion. In the light-emitting display device 100 according to an exemplary embodiment of the present disclosure, the gate driver is disposed on the active area AA to reduce the size of the non-active area NA and may independently operate the first active area AA1 and the second active area AA2 in the share mode or the private mode. The gate driver will be described in more detail with reference to FIG. 10 and FIG. 11.

At least one flexible film COF is disposed at one end of the display panel PN. The plurality of flexible films COF may be electrically connected to the non-active area NA of the display panel PN. Each of the plurality of flexible films COF is a film in which various components are disposed on a base film having malleability. Each of the plurality of flexible films COF supplies a signal to the plurality of sub-pixels SP and driving circuits in the active area AA. Also, each of the plurality of flexible films COF may be electrically connected to the display panel PN. For example, the plurality of flexible films COF may supply a power voltage, a data voltage, or the like to the plurality of sub-pixels SP and the driving circuits in the active area AA.

Meanwhile, a driver IC such as a data driver IC may be disposed in the plurality of flexible films COF. The driving IC is configured to process data for displaying an image and a driving signal for processing the data. The driving IC may be disposed by a chip on glass (COG), a chip on film (COF), or a tape carrier package (TCP) technique depending on a mounting method. However, for the convenience of description, the driving IC is described, for example, as being disposed on the plurality of flexible films COF by the COF technique, but is not limited thereto. The driving IC may also be disposed as a single chip integrated with a timing controller.

Each of the plurality of printed circuit boards PCB is electrically connected to the plurality of flexible films COF. The plurality of printed circuit boards PCB is configured to supply a signal to the driving IC. Various components for supplying various signals, such as a driving signal and a data signal, to the driving IC may be disposed in the plurality of printed circuit boards PCB.

Hereinafter, the display panel of the light-emitting display device 100 according to an exemplary embodiment of the present disclosure will be described with reference to FIG. 2 and FIG. 3.

Figure 2:
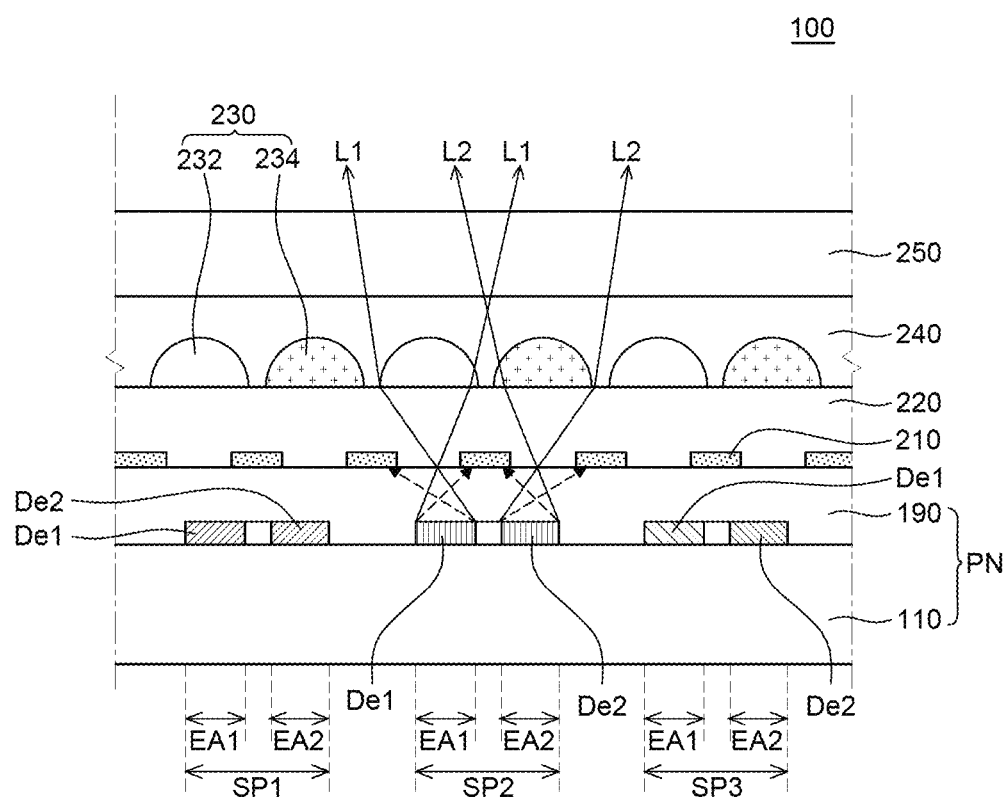
FIG. 2 is a schematic cross-sectional view of the light-emitting display device according to an exemplary embodiment of the present disclosure.

FIG. 2 is a schematic cross-sectional view of the light-emitting display device according to an exemplary embodiment of the present disclosure. FIG. 3 is a schematic cross-sectional view of a display panel of the light-emitting display device according to an exemplary embodiment of the present disclosure.

Referring to FIG. 2, the light-emitting display device 100 according to an exemplary embodiment of the present disclosure includes the display panel PN, a light blocking pattern 210, and an optical gap layer 220. Also, the light-emitting display device 100 according to an exemplary embodiment of the present disclosure includes a lens layer 230, a planarization film 240, and a polarization layer 250.

Figure 3:
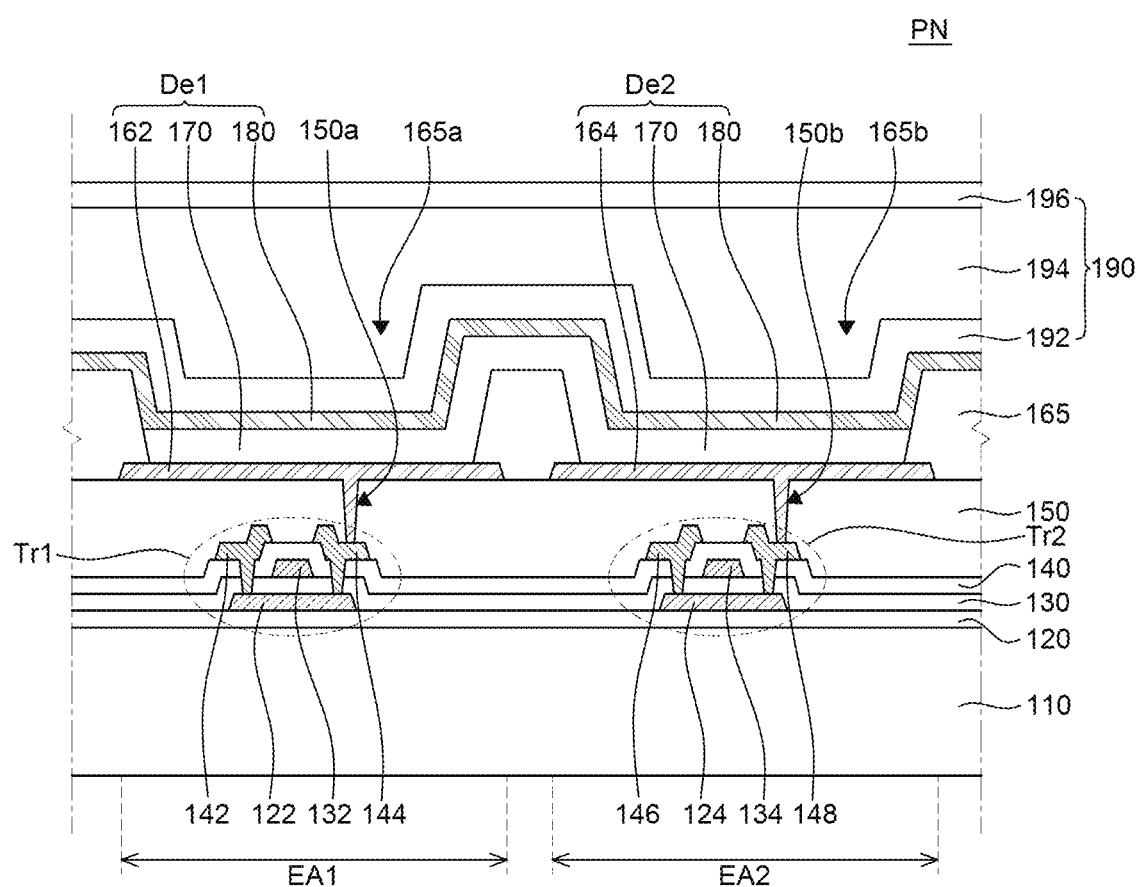
FIG. 3 is a schematic cross-sectional view of a display panel of the light-emitting display device according to an exemplary embodiment of the present disclosure.

Referring to FIG. 2 and FIG. 3 together, the display panel PN includes a substrate 110, a plurality of first LEDs De1, a plurality of second LEDs De2, and a sealing layer 190.

The plurality of sub-pixels SP including first to third sub-pixels SP1, SP2, and SP3 is defined on the substrate 110. Further, each of the first to third sub-pixels SP1, SP2, and SP3 includes a first emission area EA1 and a second emission area EA2.

A first LED De1 is provided in the first emission area EA1, and a second LED De2 is provided in the second emission area EA2.

The first to third sub-pixels SP1, SP2, and SP3 may be a red sub-pixel, a green sub-pixel, and a blue sub-pixel, respectively. Therefore, the first LED De1 and the second LED De2 of the first sub-pixel SP1 may emit red light, and the first LED De1 and the second LED De2 of the second sub-pixel SP2 may emit green light. Also, the first LED De1 and the second LED De2 of the third sub-pixel SP3 may emit blue light.

Referring to FIG. 2 and FIG. 3, the display panel PN of the light-emitting display device 100 according to an exemplary embodiment of the present disclosure includes the substrate 110 and a plurality of thin film transistors Tr1 and Tr2. Also, the display panel PN of the light-emitting display device 100 according to an exemplary embodiment of the present disclosure includes a plurality of LEDs De1 and De2 and the sealing layer 190.

Specifically, each sub-pixel SP on the substrate 110 includes the first emission area EA1 and the second emission area EA2. The substrate 110 may be a glass substrate or a plastic substrate.

For example, the plastic substrate may be made of polyimide (PI), but is not limited thereto.

A buffer layer 120 may be formed on the substrate 110. The buffer layer 120 is positioned on substantially the entire surface of the substrate 110. The buffer layer 120 may be made of an inorganic material such as silicon oxide ($SiO_2$) or silicon nitride ($SiN_x$), and may be configured by a single layer or multiple layers.

A first semiconductor layer 122 and a second semiconductor layer 124 are patterned in the first emission area EA1 and the second emission area EA2, respectively, on the buffer layer 120.

Each of the first semiconductor layer 122 and the second semiconductor layer 124 may be made of an oxide semiconductor material. In this case, a shield pattern may be further formed under the first semiconductor layer 122 and the second semiconductor layer 124. The shield pattern blocks light incident into the first semiconductor layer 122 and the second semiconductor layer 124 and thus suppresses thermal degradation of the first semiconductor layer 122 and the second semiconductor layer 124.

Alternatively, each of the first semiconductor layer 122 and the second semiconductor layer 124 may be made of polycrystalline silicon. In this case, both edges of each of the first semiconductor layer 122 and the second semiconductor layer 124 may be doped with impurities.

A gate insulating film 130 made of an insulating material is formed on the first semiconductor layer 122 and the second semiconductor layer 124 substantially over the entire surface of the substrate 110. The gate insulating film 130 may be made of an inorganic insulating material such as silicon oxide ($SiO_2$) or silicon nitride ($SiN_x$).

If the first semiconductor layer 122 and the second semiconductor layer 124 are made of an oxide semiconductor material, the gate insulating film 130 may be made of silicon oxide ($SiO_2$). If the first semiconductor layer 122 and the second semiconductor layer 124 are made of polycrystalline silicon, the gate insulating film 130 may be made of silicon oxide ($SiO_2$) or silicon nitride ($SiN_x$).

A first gate electrode 132 and a second gate electrode 134 made of a conductive material such as metal are formed on the gate insulating film 130 corresponding to the first semiconductor layer 122 and the second semiconductor layer 124, respectively. Also, a scan signal line (not shown) may be formed on the gate insulating film 130. The scan signal line may extend along one direction.

Meanwhile, the gate insulating film 130 is formed on the entire surface of the substrate 110 according to an exemplary embodiment of the present disclosure. However, the gate insulating film 130 may be patterned to have the same shape as the first gate electrode 132 and the second gate electrode 134 and disposed only under the first gate electrode 132 and the second gate electrode 134.

An interlayer insulating film 140 made of an insulating material is formed on the first gate electrode 132 and the second gate electrode 134 substantially over the entire surface of the substrate 110. The interlayer insulating film 140 may be made of an inorganic insulating material such as silicon oxide ($SiO_2$) or silicon nitride ($SiN_x$), or may be made of an organic insulating material such as photo acryl or benzocyclobutene.

The interlayer insulating film 140 includes contact holes that expose an upper surface of each of the first semiconductor layer 122 and the second semiconductor layer 124. The contact holes may also be formed in the gate insulating film 130. First source and drain electrodes 142 and 144 and second source and drain electrodes 146 and 148 made of a conductive material such as metal are formed in the first emission area EA1 and the second emission area EA2, respectively, on the interlayer insulating film 140. Also, a data line (not shown) and a power supply line (not shown) extending along a direction perpendicular to the one direction may be formed on the interlayer insulating film 140.

The first source electrode 142 and the first drain electrode 144 are in contact with both sides of the first semiconductor layer 122 through the contact holes of the interlayer insulating film 140. The second source electrode 146 and the second drain electrode 148 are in contact with both sides of the second semiconductor layer 124 through the contact holes of the interlayer insulating film 140. Although not illustrated in the drawings, the data line extends along the direction perpendicular to the one direction and intersects the scan signal line to define a pixel area corresponding to each sub-pixel SP. Also, the power supply line that supplies a high-potential voltage is spaced apart from the data line.

Meanwhile, the first semiconductor layer 122, the first gate electrode 132, the first source electrode 142, and the first drain electrode 144 constitute a first thin film transistor Tr1. Also, the second semiconductor layer 124, the second gate electrode 134, the second source electrode 146, and the second drain electrode 148 constitute a second thin film transistor Tr2.

At least one thin film transistor having the same structure as the first thin film transistor Tr1 and the second thin film transistor Tr2 may be further formed on the substrate 110 of each sub-pixel SP. However, the present disclosure is not limited thereto.

A protective film 150 made of an insulating material is formed on the first source electrode 142, the first drain electrode 144, the second source electrode 146, and the second drain electrode 148 substantially over the entire surface of the substrate 110. The protective film 150 may be made of an organic insulating material such as photo acryl or benzocyclobutene. The protective film 150 has a flat upper surface.

Meanwhile, an insulating film made of an inorganic insulating material such as silicon oxide ($SiO_2$) or silicon nitride ($SiN_x$) may be further formed under the protective film 150. Configured to be, the insulating film may be further formed between the first and second thin film transistors Tr1 and Tr2 and the protective film 150.

The protective film 150 includes a first drain contact hole 150a and a second drain contact hole 150b that expose the first drain electrode 144 and the second drain electrode 148, respectively.

A first anode electrode 162 and a second anode electrode 164 made of a conductive material having a relatively high work function are formed on the protective film 150. The first anode electrode 162 is positioned in the first emission area EA1 and is in contact with the first drain electrode 144 through the first drain contact hole 150a. Also, the second anode electrode 164 is positioned in the second emission area EA2 and is in contact with the second drain electrode 148 through the second drain contact hole 150b.

For example, each of the first anode electrode 162 and the second anode electrode 164 may be made of a transparent conductive material such as indium tin oxide (ITO) or indium zinc oxide (IZO), but is not limited thereto.

Meanwhile, the display panel PN of the light-emitting display device 100 according to an exemplary embodiment of the present disclosure may be of a top emission type where light emitted from a plurality of LEDs is output toward an upper side of the substrate 110. Accordingly, each of the first anode electrode 162 and the second anode electrode 164 may further include a reflective electrode or reflective layer made of a metal material having high reflectivity under the transparent conductive material. For example, the reflective electrode or reflective layer may be made of an aluminum-palladium-copper (APC) alloy, silver (Ag), or aluminum (Al). In this case, each of the first anode electrode 162 and the second anode electrode 164 may have a triple-layer structure of ITO/APC/ITO, ITO/Ag/ITO, or ITO/Al/ITO, but is not limited thereto.

A bank 165 made of an insulating material may be formed on the first anode electrode 162 and the second anode electrode 164. The bank 165 overlaps edges of the first anode electrode 162 and the second anode electrode 164 and covers the edges of the first anode electrode 162 and the second anode electrode 164. The bank 165 includes a first opening 165a and a second opening 165b that expose the first anode electrode 162 and the second anode electrode 164, respectively.

At least an upper surface of the bank 165 is hydrophobic, and side surfaces of the bank 165 may be hydrophobic or hydrophilic. The bank 165 may be made of an organic insulating material having hydrophobic properties. Alternatively, the bank 165 may be made of an organic insulating material having hydrophilic properties and subjected to a hydrophobic treatment.

The bank 165 has a single-layer structure in the present disclosure, but may have a double-layer structure. Configured to be, the bank 165 may have a double-layer structure including a lower bank 165 which is hydrophilic and an upper bank 165 which is hydrophobic.

Then, an emission layer 170 is formed on the first anode electrode 162 and the second anode electrode 164 exposed through the first opening 165a and the second opening 165b of the bank 165. The emission layer 170 on the first anode electrode 162 and the emission layer 170 on the second anode electrode 164 are connected to each other as one body. However, the present disclosure is not limited thereto. Alternatively, the emission layer 170 on the first anode electrode 162 and the emission layer 170 on the second anode electrode 164 may be separated from each other.

Although not illustrated in the drawings, the emission layer 170 may include a first charge auxiliary layer, a light-emitting material layer, and a second charge auxiliary layer sequentially positioned on the first anode electrode 162 and the second anode electrode 164. The light-emitting material layer may be made of any one of red, green, and blue light-emitting materials, but is not limited thereto. The light-emitting materials may be organic light-emitting materials such as phosphorescent compounds or fluorescent compounds. However, the present disclosure is not limited thereto. An inorganic light-emitting material such as a quantum dot may also be used.

The first charge auxiliary layer may be a hole auxiliary layer, and the hole auxiliary layer may include at least one of a hole injection layer (HIL) and a hole transport layer (HTL). Also, the second charge auxiliary layer may be an electron auxiliary layer, and the electron auxiliary layer may include at least one of an electron injection layer (EIL) and an electron transport layer (ETL).

The emission layer 170 may be formed by an evaporation process. In this case, a fine metal mask (FMM) may be used for patterning the emission layer 170 in each sub-pixel SP. Alternatively, the emission layer 170 may be formed by a solution process. In this case, the emission layer 170 may be provided only in the first opening 165a and the second opening 165b. Also, the emission layer 170 around the bank 165 may have a greater height as it gets closer to the bank 165.

A cathode electrode 180 made of a conductive material having a relatively low work function is formed on the emission layer 170 substantially over the entire surface of the substrate 110. Herein, the cathode electrode 180 may be made of aluminum, magnesium, silver, or an alloy thereof. In this case, the cathode electrode 180 has a relatively small thickness to transmit light emitted from the emission layer 170.

Alternatively, the cathode electrode 180 may be made of a transparent conductive material such as indium gallium oxide (IGO), but is not limited thereto.

The first anode electrode 162, the emission layer 170 and the cathode electrode 180 in the first emission area EA1 constitute the first LED De1. Also, the second anode electrode 164, the emission layer 170, and the cathode electrode 180 in the second emission area EA2 constitute the second LED De2.

As described above, the display panel PN according to an exemplary embodiment of the present disclosure may be of the top emission type where light emitted from the emission layer 170 of the first LED De1 and the second LED De2 is output in a direction opposite to the substrate 110, e.g., to the outside through the cathode electrode 180. The top emission display panel PN may have a greater emission area than a bottom emission display panel having the same size and thus may have improved luminance and reduced power consumption.

The sealing layer 190 having a flat upper surface is formed on the cathode electrode 180 substantially over the entire surface of the substrate 110. The sealing layer 190 suppresses introduction of moisture or oxygen from the outside into the first LED De1 and the second LED De2. Thus, the sealing layer 190 may also be referred to as an encapsulation layer.

The sealing layer 190 may have a laminated structure including a first inorganic film 192, an organic film 194, and a second inorganic film 196. Herein, the organic film 194 may serve to cover foreign matters generated during a manufacturing process.

Referring back to FIG. 2, the light blocking pattern 210 is provided on the display panel PN, specifically, on the sealing layer 190. The light blocking pattern 210 may be formed between the first to third sub-pixels SP1, SP2, and SP3 adjacent to each other and may be formed between the first emission area EA1 and the second emission area EA2.

The light blocking pattern 210 may be a black matrix, and may be made of black resin or chromium oxide. Alternatively, the light blocking pattern 210 may be a touch electrode, and may be made of metal. In this case, the touch electrode includes a plurality of transmission electrodes and a plurality of reception electrodes intersecting each other. The touch electrode may sense a touch based on a variance in capacitance between the plurality of transmission electrodes and the plurality of reception electrodes.

The optical gap layer 220 is provided on the light blocking pattern 210. The optical gap layer 220 secures an optical gap between the first and second LEDs De1 and De2 and lenses 232 and 234 of the lens layer 230 to allow light emitted from the first LED De1 and the second LED De2 to be refracted by the lenses 232 and 234 in a specific direction. Thus, the optical gap layer 220 improves the efficiency of the lenses 232 and 234. The optical gap layer 220 may have a thickness of several to several tens of μm, and may be made of an organic insulating material.

For example, the optical gap layer 220 may be made of photo acryl, benzocyclobutene, polyimide (PI), or polyamide (PA), but is not limited thereto.

The lens layer 230 is provided on the optical gap layer 220. The lens layer 230 includes a first lens 232 and a second lens 234. The first lens 232 is disposed in the first emission area EA1 to refract light emitted from the first LED De1 in a specific direction. Also, the second lens 234 is disposed in the second emission area EA2 to refract light emitted from the second LED De2 in a specific direction. A part of each of the first lens 232 and the second lens 234 may overlap the light blocking pattern 210.

The first lens 232 is a half-spherical lens, and the second lens 234 is a half-cylindrical lens. Thus, first light L1 emitted from the first LED De1 of each sub-pixel SP is refracted at a specific angle by the first lens 232 and then output. Also, second light L2 emitted from the second LED De2 of each sub-pixel SP is refracted at a specific angle by the second lens 234 and then output. Accordingly, it is possible to limit a viewing angle of each sub-pixel SP.

As shown in FIG. 2, in one embodiment, the first lens 232 at least partially overlaps with the first emission area EA1 and the second lens 234 at least partially overlaps with the second emission area EA2.

The planarization film 240 is provided on the lens layer 230 to protect the first lens 232 and the second lens 234. The planarization film 240 is made of an organic insulating material and has a flat upper surface. Also, the planarization film 240 has a lower refractive index than the first lens 232 and the second lens 234.

For example, the planarization film 240 may be made of photo acryl, benzocyclobutene, PI, or PA, but is not limited thereto.

The polarization layer 250 is provided on the planarization film 240. The polarization layer 250 may include a linear polarization layer and a retardation layer. Also, the polarization layer 250 serves to change a polarization state of external light incident into the display panel PN and suppress re-emission of external light reflected from the display panel PN to the outside.

Meanwhile, in the light-emitting display device 100 according to an exemplary embodiment of the present disclosure, each sub-pixel SP includes the first emission area EA1 and the second emission area EA2. Also, the first lens 232 having a half-spherical shape is provided in an upper part of the first emission area EA1, and the second lens 234 having a half-cylindrical shape is provided in an upper part of the second emission area EA2 to limit a viewing angle. Therefore, it is possible to implement the share mode and the private mode.

Figure 4A:
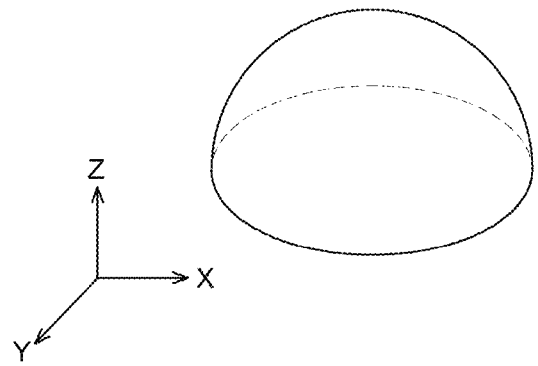
FIG. 4A schematically illustrates a first lens of the light-emitting display device according to an exemplary embodiment of the present disclosure.
Figure 4B:
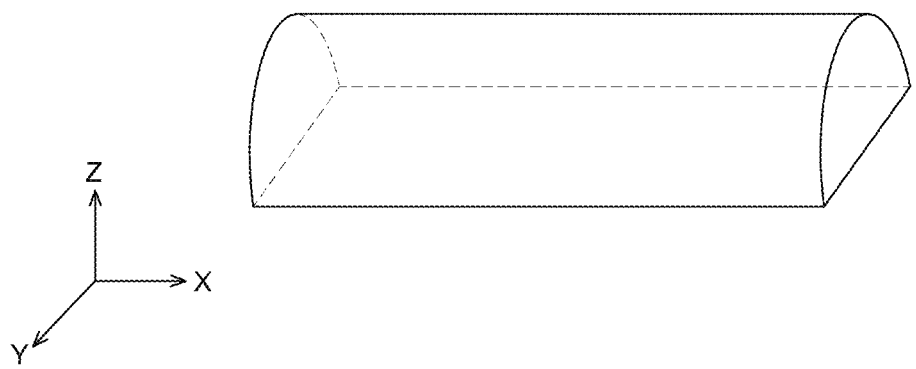
FIG. 4B schematically illustrates a second lens of the light-emitting display device according to an exemplary embodiment of the present disclosure.

FIG. 4A schematically illustrates a first lens of the light-emitting display device according to an exemplary embodiment of the present disclosure. FIG. 4B schematically illustrates a second lens of the light-emitting display device according to an exemplary embodiment of the present disclosure.

As shown in FIG. 4A, the first lens 232 is a half-spherical lens having a semicircular cross-section in X- and Y-axis directions. Therefore, the first lens 232 limits a viewing angle in the X- and Y-axis directions.

Also, as shown in FIG. 4B, the second lens 234 is a half-cylindrical lens having a rectangular cross-section in the X-axis direction and a semicircular cross-section in the Y-axis direction. Therefore, the second lens 234 limits the viewing angle in the Y-axis direction, but does not limit the viewing angle in a longitudinal direction of the second lens 234, e.g., in the X-axis direction.

Hereinafter, viewing angle characteristics of the first lens 232 and the second lens 234 will be described with reference to FIG. 5A and FIG. 5B.

Figure 5A:
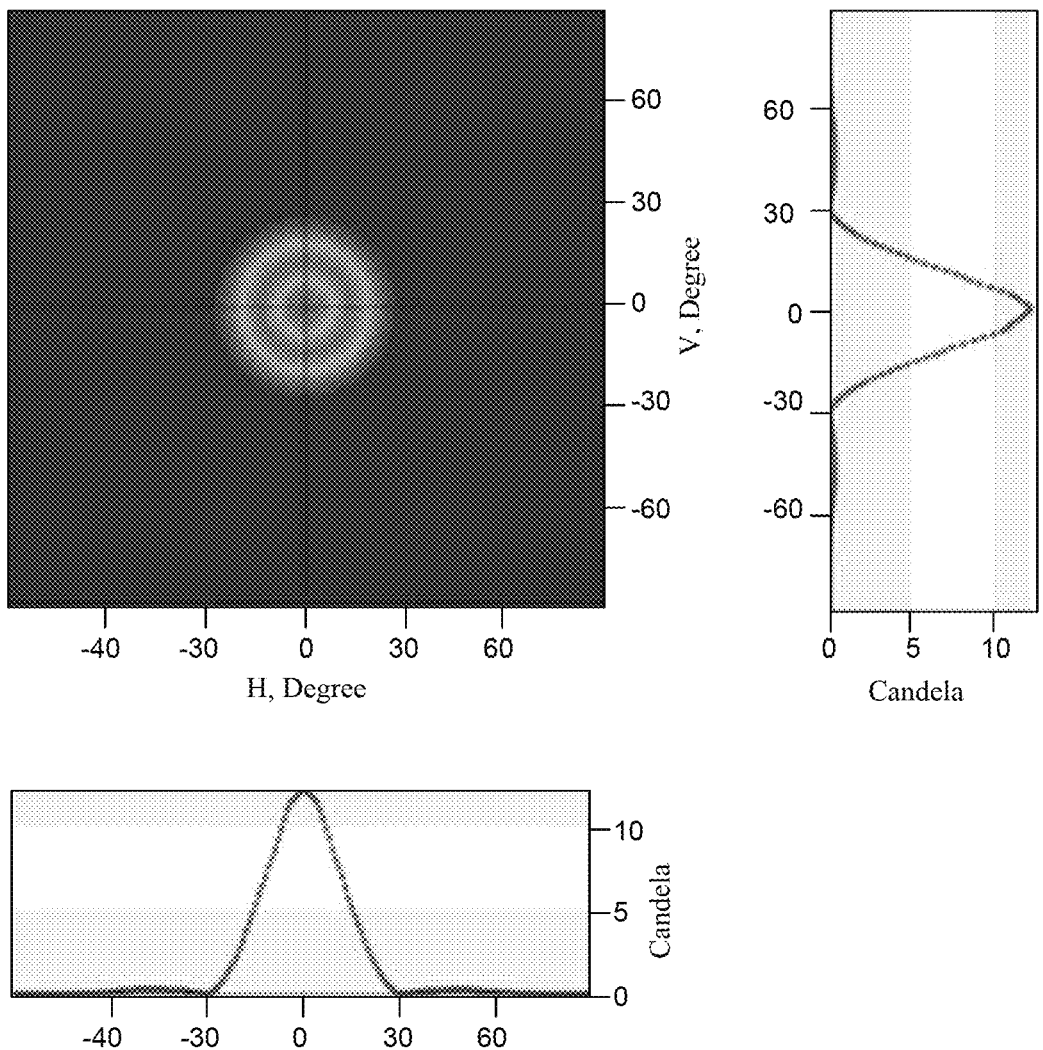
FIG. 5A shows an optical profile for a viewing angle of the first lens of the light-emitting display device according to an exemplary embodiment of the present disclosure.

FIG. 5A shows an optical profile for a viewing angle of the first lens of the light-emitting display device according to an exemplary embodiment of the present disclosure. FIG. 5B shows an optical profile for a viewing angle of the second lens of the light-emitting display device according to an exemplary embodiment of the present disclosure.

Figure 5B:
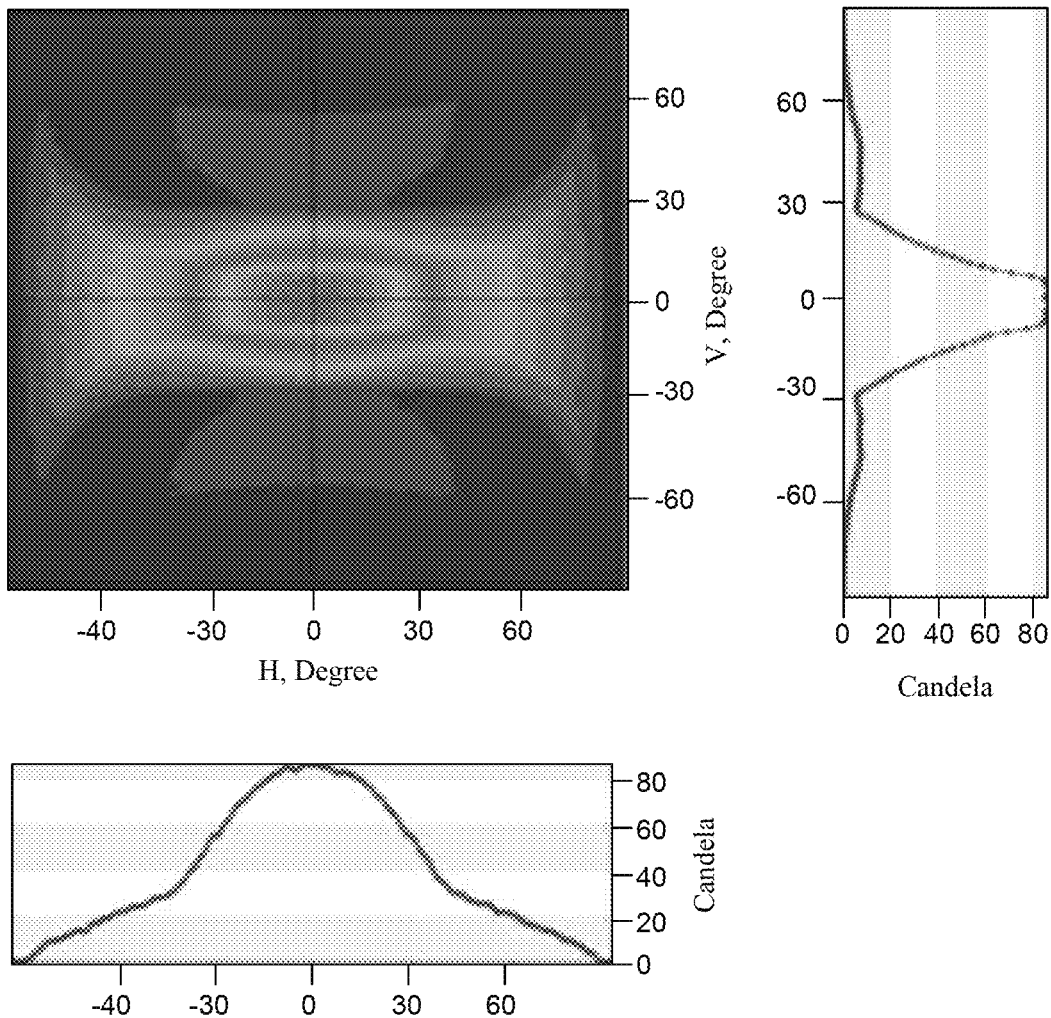
FIG. 5B shows an optical profile for a viewing angle of the second lens of the light-emitting display device according to an exemplary embodiment of the present disclosure.

As shown in FIG. 5A and FIG. 5B, the first emission area EA1 provided with the first lens 232 having a half-spherical shape has a narrow viewing angle of 30 degrees or less in up and down directions and left and right directions. Also, the second emission area EA2 provided with the second lens 234 having a half-cylindrical shape has a narrow viewing angle of 30 degrees or less in the up and down directions and a wide viewing angle of 60 degrees or more in the left and right directions.

Therefore, when the first emission area EA1 operates, the private mode in the up and down directions and the private mode in the left and right directions can be implemented. Also, when the second emission area EA2 operates, the private mode in the up and down directions and the share mode in the left and right directions can be implemented.

The light-emitting display device 100 according to an exemplary embodiment of the present disclosure can always achieve a narrow viewing angle in the up and down directions by the first and second lenses 232 and 234. Also, the share mode and the private mode can be selectively implemented in the left and right directions.

Hereinafter, the share mode and the private mode in the left and right directions will be described with reference to FIG. 6.

Figure 6:
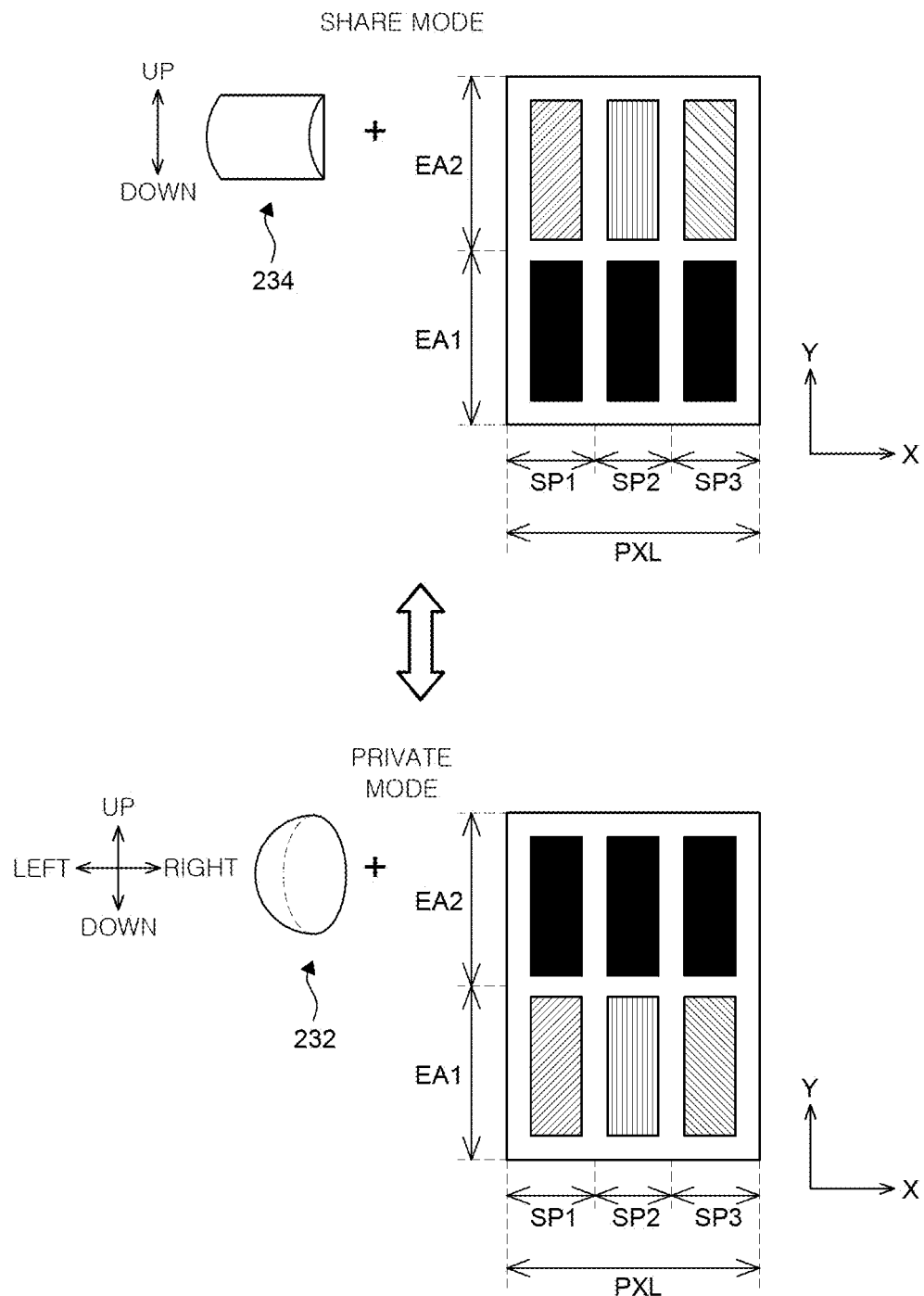
FIG. 6 schematically illustrates a share mode operation and a private mode operation of the light-emitting display device according to an exemplary embodiment of the present disclosure.

FIG. 6 schematically illustrates a share mode operation and a private mode operation of the light-emitting display device according to an exemplary embodiment of the present disclosure.

As shown in FIG. 6, a pixel of the viewing angle switchable light-emitting display device 100 according to an exemplary embodiment of the present disclosure includes the plurality of sub-pixels SP, for example, the first to third sub-pixels SP1, SP2, and SP3. Also, each of the first to third sub-pixels SP1, SP2, and SP3 includes the first emission area EA1 and the second emission area EA2.

The first lens 232 having a half-spherical shape is provided corresponding to the first emission area EA1, and the second lens 234 having a half-cylindrical shape is provided corresponding to the second emission area EA2.

In the share mode, the first LED De1 of the first emission area EA1 is turned off and the second LED De2 of the second emission area EA2 is turned on. Also, light emitted from the second LED De2 is limited in viewing angle in the Y-axis direction, e.g., in the up and down directions, by the second lens 234, and output in the X-axis direction, e.g., in the left and right directions, without limitation. In other words, the viewing angle of the second lens 234 is different and in most cases larger than the viewing angle of the first lens 232.

Meanwhile, in the private mode, the first LED De1 of the first emission area EA1 is turned on and the second LED De2 of the second emission area EA2 is turned off. Also, light emitted from the first LED De1 is limited in viewing angle in the up and down directions and the left and right directions by the first lens 232 and then output.

As described above, the light-emitting display device 100 according to one embodiment of the present disclosure may always have a narrow viewing angle in the up and down directions (e.g., vertical direction). If the light-emitting display device 100 according to an exemplary embodiment of the present disclosure having a narrow viewing angle in the up and down directions is applied to a vehicle, it is possible to suppress blocking of the driver's view caused by reflection of an image from a front window of the vehicle.

Also, in the share mode, an image having a wide viewing angle in the left and right directions (e.g., horizontal direction) may be displayed. Further, in the private mode, an image having a narrow viewing angle in the left and right directions may be displayed. In the share mode, both users in a driver seat and a passenger seat can view the image. In the private mode, one of the users in the driver seat and the passenger seat can view the image. For instance, according to one embodiment of the private mode, the display device can display an image such that only one of the user sitting on either the driver seat or the passenger seat can view the image but not both at the same time. That is, in one embodiment, a degree of the viewing angle limited in the left direction can be different from a degree of the viewing angle limited in the right direction during the private mode so that only one of the users sitting on either the driver seat or the passenger seat can view the image from the display device. For example, the viewing angle can be limited in the left direction (e.g., the direction of the driver seat) and not limited in the right direction (e.g., the direction of the passenger seat) such that only the user sitting on the passenger seat can view the image from the display device. The value of the viewing angle is thus different and is larger in the share mode than in the private mode. Further, the share mode and the private mode can be selectively implemented in the left and right directions.

Hereinafter, a configuration and an operation method of the plurality of sub-pixels SP will be described in detail.

Figure 7:
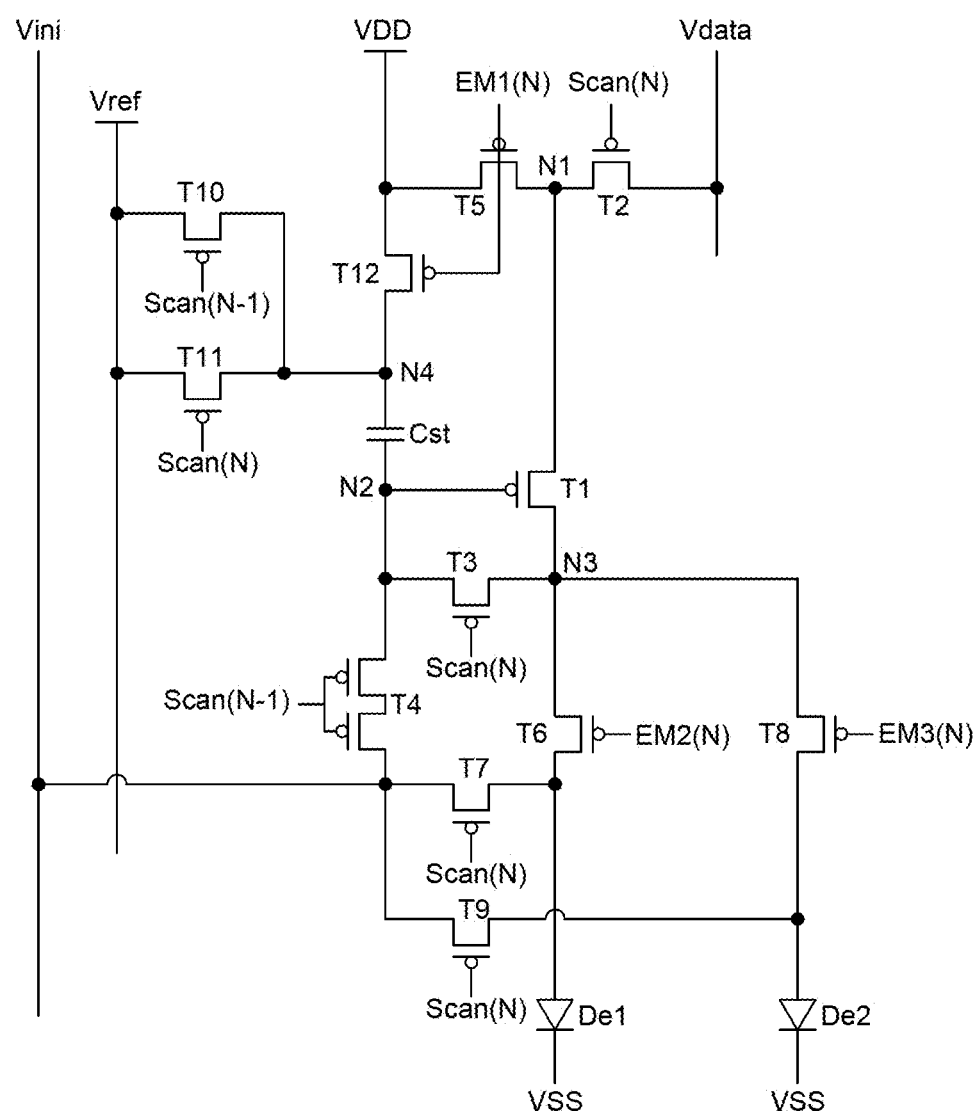
FIG. 7 is a circuit diagram of a sub-pixel of the light-emitting display device according to an exemplary embodiment of the present disclosure.

FIG. 7 is a circuit diagram of a sub-pixel of the light-emitting display device according to an exemplary embodiment of the present disclosure. For the convenience of description, FIG. 7 shows a circuit diagram of a sub-pixel SP disposed in an Nth row among the plurality of sub-pixels SP.

Referring to FIG. 7, the sub-pixel SP includes a first transistor T1, a second transistor T2, a third transistor T3, a fourth transistor T4, a fifth transistor T5, a sixth transistor T6, and a seventh transistor T7. Also, the sub-pixel SP includes an eighth transistor T8, a ninth transistor T9, a tenth transistor T10, an eleventh transistor T11, a twelfth transistor T12, a storage capacitor Cst, the first LED De1, and the second LED De2.

First, switch elements constituting each of the plurality of sub-pixels SP may be implemented with a transistor having an n-type or p-type MOSFET structure. In the following exemplary embodiment, a p-type transistor is illustrated, but the present disclosure is not limited thereto.

Also, the transistor is a three-electrode element including a gate electrode, a source electrode, and a drain electrode. The source electrode is an electrode that supplies carriers to the transistor. The carriers start to flow from the source electrode within the transistor. The drain electrode is an electrode in which the carriers in the transistor are discharged to the outside. Configured to be, in a MOSFET, the carriers flow from the source electrode to the drain electrode. In an n-type MOSFET (NMOS), the carriers are electrons, and, thus, a voltage of the source electrode is lower than a voltage of the drain electrode to enable the electrons to flow from the source electrode to the drain electrode. In the n-type MOSFET, the electrons flow from the source electrode toward the drain electrode, and, thus, a current flows from the drain electrode toward the source electrode. In a p-type MOSFET (PMOS), the carriers are holes, and, thus, a voltage of the source electrode is higher than a voltage of the drain electrode to enable the holes to flow from the source electrode to the drain electrode. In the p-type MOSFET, the holes flow from the source electrode toward the drain electrode, and, thus, a current flows from the source electrode toward the drain electrode. It should be noted that the source electrode and the drain electrode of the MOSFET are not fixed. For example, the source electrode and the drain electrode of the MOSFET may be changed depending on an applied voltage. In the following exemplary embodiment, it should be noted that the present disclosure is not limited by the source electrode and the drain electrode of the transistor.

Referring to FIG. 7, the first transistor T1 controls a driving current applied to a plurality of LEDs depending on a source-gate voltage Vsg. The first transistor T1 includes a source electrode connected to a first node N1, a gate electrode connected to a second node N2, and a drain electrode connected to a third node N3. The first transistor T1 configured to control a driving current applied to the LEDs De1 and De2 may also be referred to as a driving transistor.

The second transistor T2 applies a data voltage Vdata from a data line to the first node N1. The second transistor T2 includes a source electrode connected to the data line, a drain electrode connected to the first node N1, and a gate electrode connected to an Nth scan signal line that transmits an Nth scan signal Scan(N). The second transistor T2 may transfer the data voltage Vdata from the data line to the first node N1 in response to the Nth scan signal Scan(N) of a low level which is a turn-on level.

The third transistor T3 diode-connects the gate electrode and the drain electrode of the first transistor T1 which is a driving transistor. The third transistor T3 includes a drain electrode connected to the second node N2, a source electrode connected to the third node N3, and a gate electrode connected to the Nth scan signal Scan(N) line that transmits the Nth scan signal Scan(N). Thus, the third transistor T3 diode-connects the gate electrode and the drain electrode of the first transistor T1 in response to the Nth scan signal Scan(N) of the low level which is a turn-on level.

The fourth transistor T4 applies an initial voltage Vini to the second node N2. The fourth transistor T4 includes a source electrode connected to an initial line that transmits the initial voltage Vini, a drain electrode connected to the second node N2, and a gate electrode connected to an N−1th scan signal line that transmits an N−1th scan signal Scan(N−1). The fourth transistor T4 applies the initial voltage Vini to the second node N2 in response to the N−1th scan signal Scan(N−1) of the low level.

The fifth transistor T5 applies a high-potential driving voltage VDD supplied from a high-potential driving voltage line to the first node N1. The fifth transistor T5 includes a source electrode connected to the high-potential driving voltage line, a drain electrode connected to the first node N1, and a gate electrode connected to a first emission signal line that transmits a first emission signal EM1(N). Thus, the fifth transistor T5 applies the high-potential driving voltage VDD supplied from the high-potential driving voltage line to the first node N1 in response to the first emission signal EM1(N) of the low level which is a turn-on level.

The sixth transistor T6 forms a current path between the first transistor T1 and the first LED De1. The sixth transistor T6 includes a source electrode connected to the third node N3, a drain electrode connected to the anode electrode of the first LED De1, and a gate electrode connected to a second emission signal line EML2 that transmits a second emission signal EM2(N). The sixth transistor T6 forms a current path between the third node N3, which is the source electrode of the sixth transistor T6, and the first LED De1 in response to the second emission signal EM2(N). Thus, the sixth transistor T6 forms a current path between the first transistor T1 which is a driving transistor and the first LED De1 in response to the second emission signal EM2(N) of the low level which is a turn-on level. Thus, the sixth transistor T6 may also be referred to as a first emission control transistor configured to control emission of the first LED De1.

The seventh transistor T7 applies the initial voltage Vini to the anode electrode of the first LED De1. The seventh transistor T7 includes a source electrode connected to the initial line that transmits the initial voltage Vini, a drain electrode connected to the anode electrode of the first LED De1, and a gate electrode connected to the Nth scan signal Scan(N) line that transmits the Nth scan signal Scan(N). Thus, the seventh transistor T7 applies the initial voltage Vini to the anode electrode of the first LED De1 in response to the Nth scan signal Scan(N) of the low level which is a turn-on level.

The eighth transistor T8 forms a current path between the first transistor T1 and the second LED De2. The eighth transistor T8 includes a source electrode connected to the third node N3, a drain electrode connected to the anode electrode of the second LED De2, and a gate electrode connected to a third emission signal line that transmits a third emission signal EM3(N). The eighth transistor T8 forms a current path between the third node N3, which is the source electrode of the eighth transistor T8, and the second LED De2 in response to the third emission signal EM3(N). Thus, the eighth transistor T8 forms a current path between the first transistor T1 which is a driving transistor and the second LED De2 in response to the third emission signal EM3(N) of the low level which is a turn-on level. Thus, the eighth transistor T8 may also be referred to as a second emission control transistor configured to control emission of the second LED De2.

The ninth transistor T9 applies the initial voltage Vini to the anode electrode of the second LED De2. The ninth transistor T9 includes a source electrode connected to the initial line that transmits the initial voltage Vini, a drain electrode connected to the anode electrode of the second LED De2, and a gate electrode connected to the Nth scan signal Scan(N) line that transmits the Nth scan signal Scan(N). Thus, the ninth transistor T9 applies the initial voltage Vini to the anode electrode of the second LED De2 in response to the Nth scan signal Scan(N) of the low level which is a turn-on level.

The tenth transistor T10 applies a reference voltage Vref to a fourth node N4. The tenth transistor T10 includes a source electrode connected to a reference line that transmits the reference voltage Vref, a drain electrode connected to the fourth node N4, and a gate electrode connected to the N−1th scan signal Scan(N−1) line that transmits the N−1th scan signal Scan(N−1). Thus, the tenth transistor T10 applies the reference voltage Vref to the fourth node N4 in response to the N−1th scan signal Scan(N−1) of the low level which is a turn-on level.

The eleventh transistor T11 applies the reference voltage Vref to the fourth node N4. The eleventh transistor T11 includes a source electrode connected to the reference line that transmits the reference voltage Vref, a drain electrode connected to the fourth node N4, and a gate electrode connected to the Nth scan signal Scan(N) line that transmits the Nth scan signal Scan(N). Thus, the eleventh transistor T11 applies the reference voltage Vref to the fourth node N4 in response to the Nth scan signal Scan(N) of the low level which is a turn-on level.

The twelfth transistor T12 applies the high-potential driving voltage VDD supplied from the high-potential driving voltage line to the fourth node N4. The twelfth transistor T12 includes a source electrode connected to the high-potential driving voltage line, a drain electrode connected to the fourth node N4, and a gate electrode connected to a first emission signal line EML1 that transmits a first emission signal EM1(N). Thus, the twelfth transistor T12 applies the high-potential driving voltage VDD supplied from the high-potential driving voltage line to the fourth node N4 in response to the first emission signal EM1(N) of the low level which is a turn-on level.

The capacitor Cst includes a first electrode connected to the first node N1 and a second electrode connected to the second node N2. Configured to be, one electrode of the capacitor Cst is connected to the gate electrode of the first transistor T1 which is a driving transistor, and the other electrode of the capacitor Cst is connected to the twelfth transistor T12.

Figure 8A:
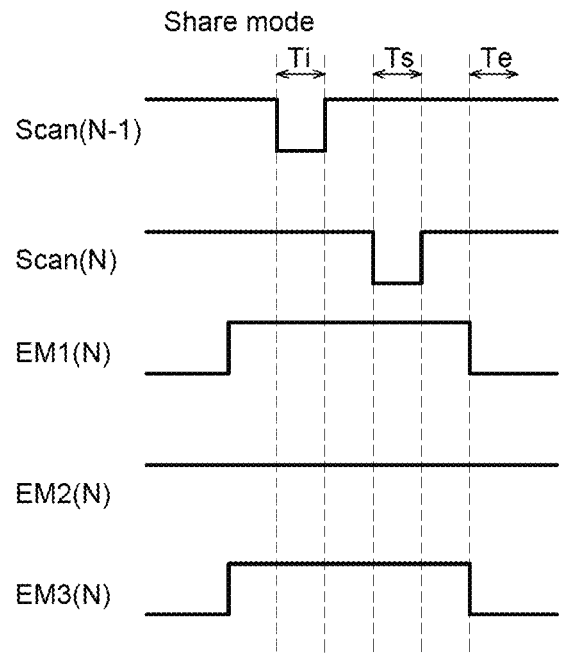
FIG. 8A is a waveform chart showing emission signals and scan signals in the share mode of the light-emitting display device according to an exemplary embodiment of the present disclosure.
Figure 8B:
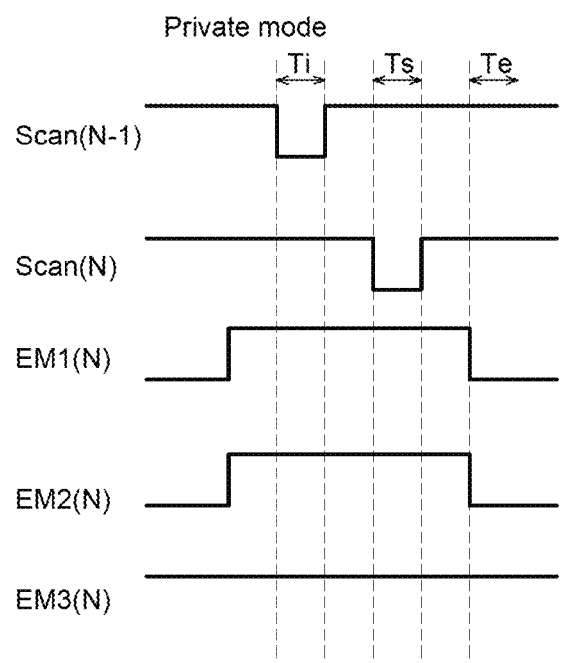
FIG. 8B is a waveform chart showing emission signals and scan signals in the private mode of the light-emitting display device according to an exemplary embodiment of the present disclosure.
Figure 9A:
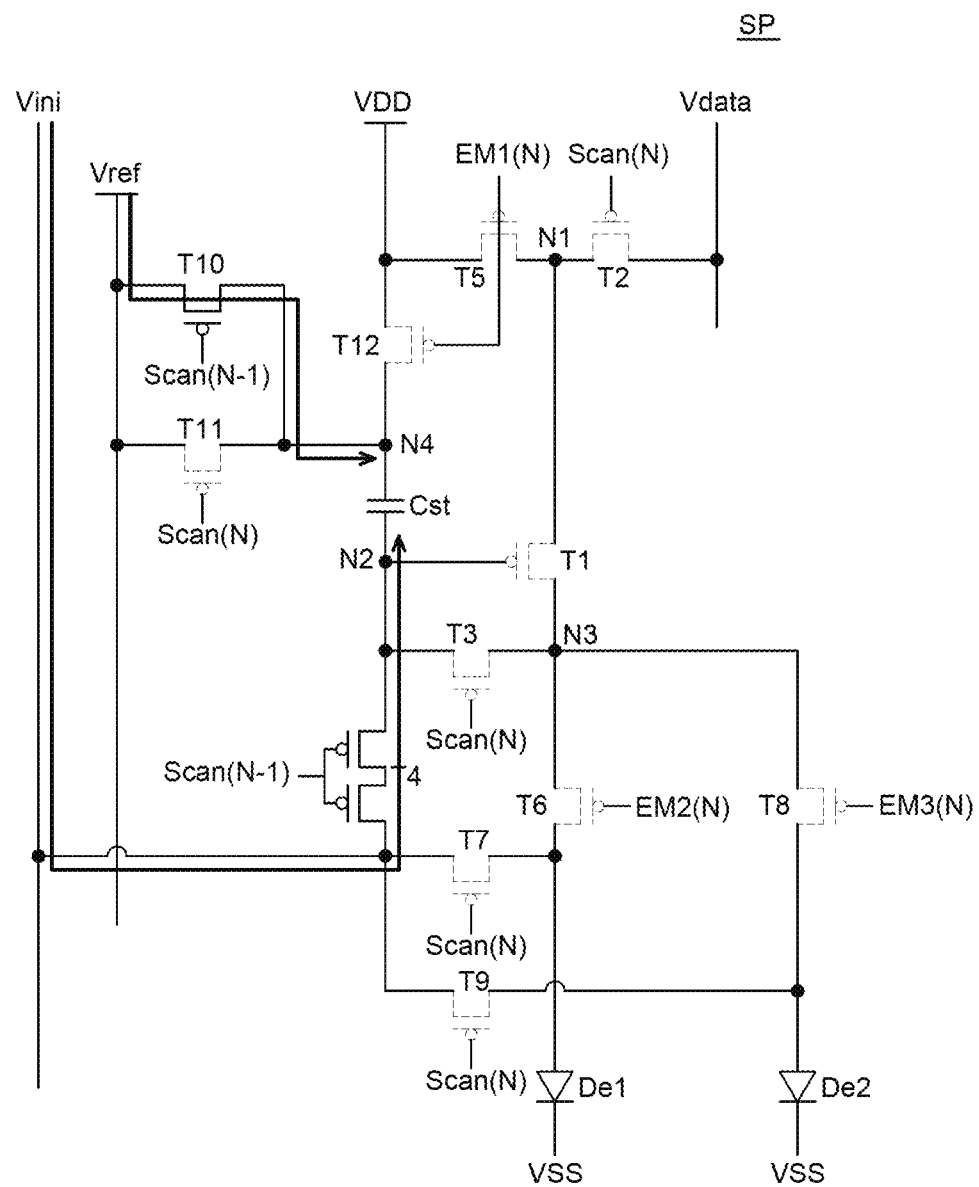
FIG. 9A is a circuit diagram of the sub-pixel of the light-emitting display device according to an exemplary embodiment of the present disclosure during an initial period in each of the share mode and the private mode.
Figure 9B:
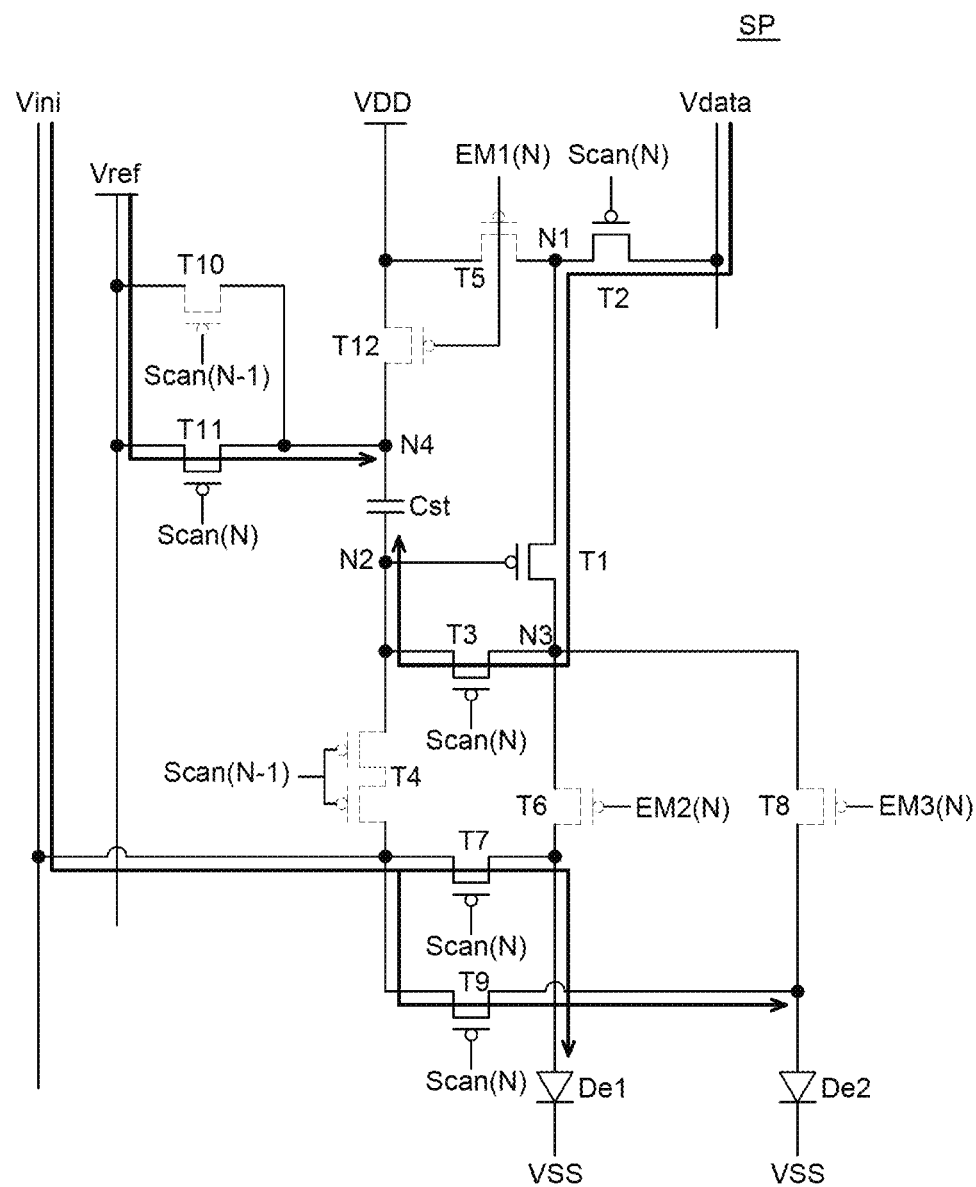
FIG. 9B is a circuit diagram of the sub-pixel of the light-emitting display device according to an exemplary embodiment of the present disclosure during a sampling period in each of the share mode and the private mode.
Figure 9C:
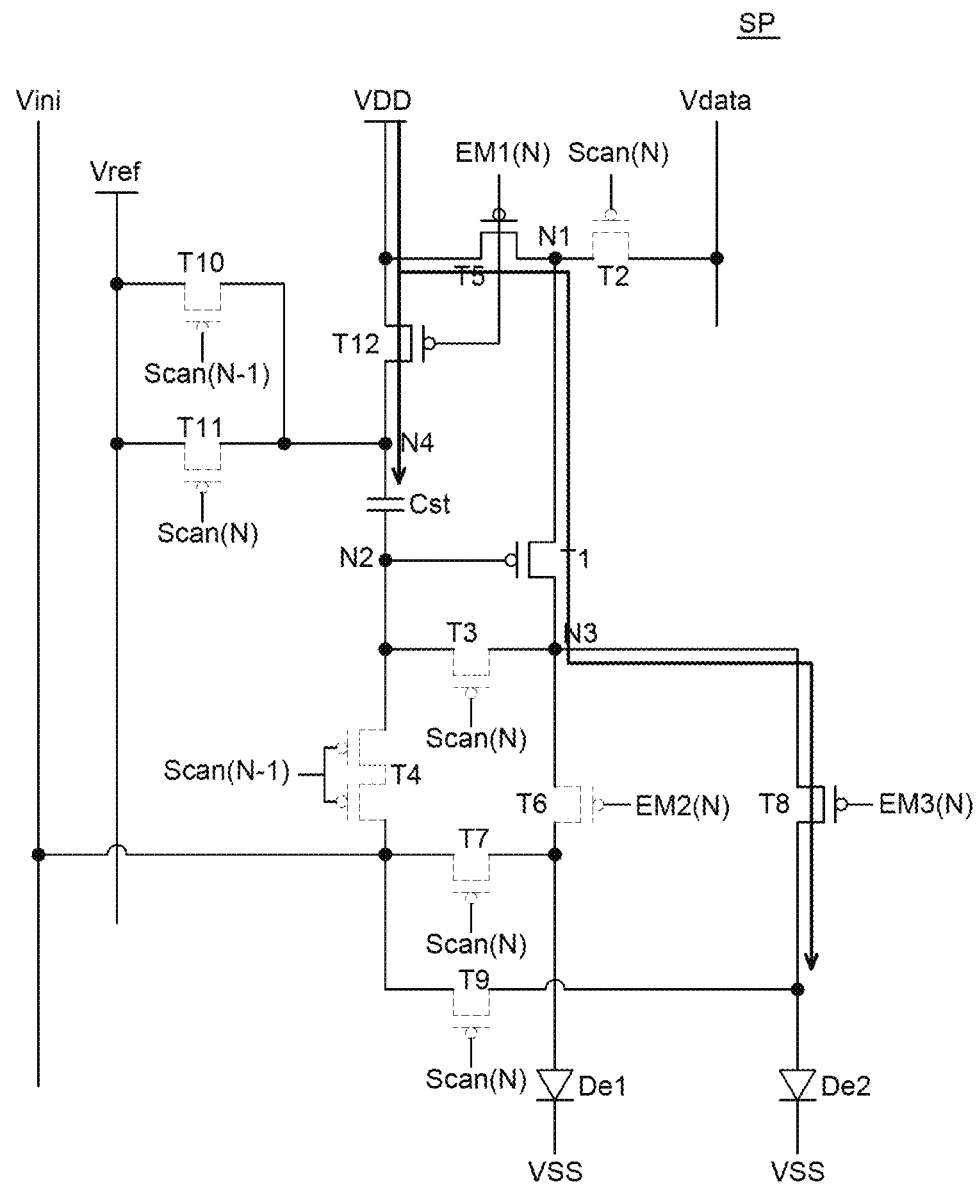
FIG. 9C is a circuit diagram of the sub-pixel of the light-emitting display device according to an exemplary embodiment of the present disclosure during an emission period in the share mode.
Figure 9D:
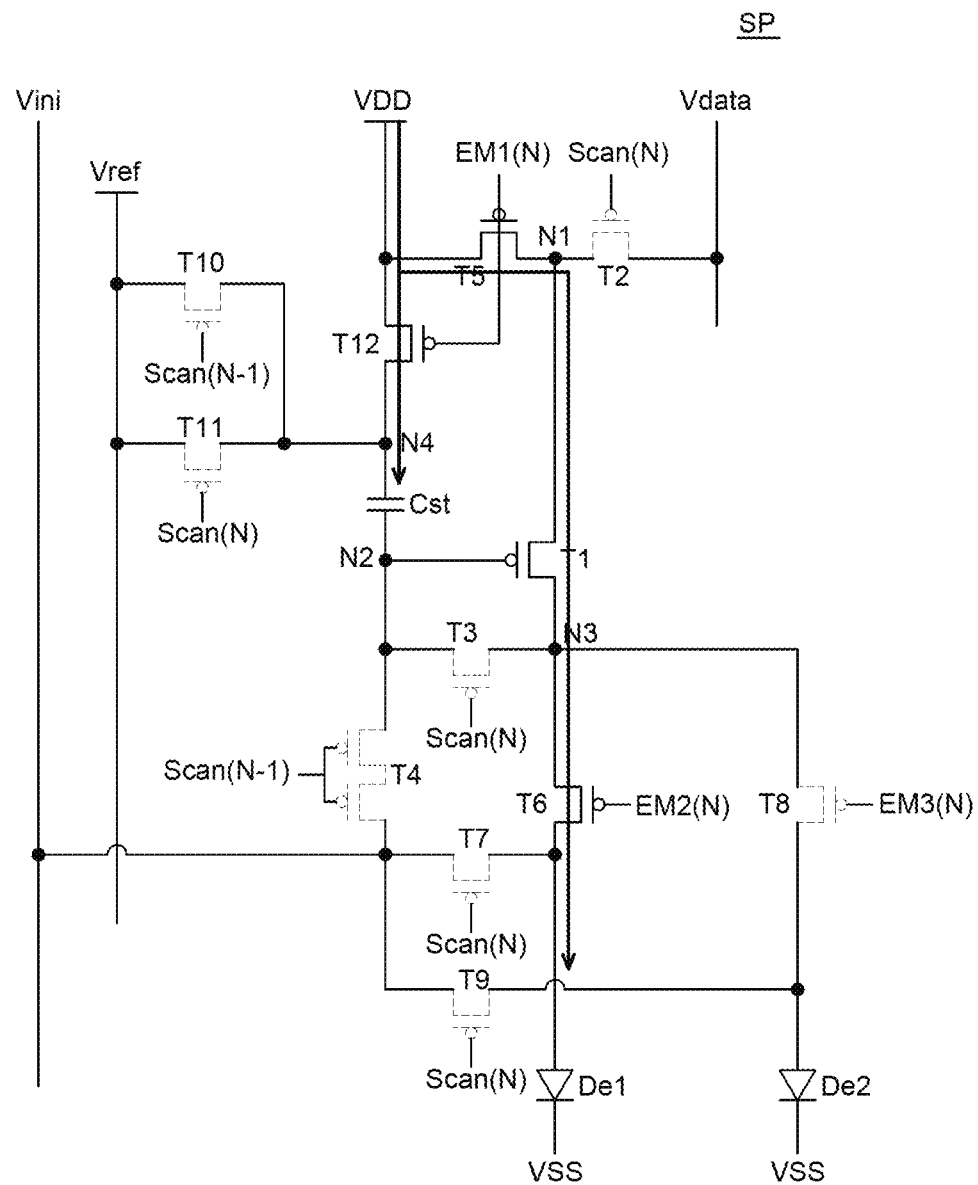
FIG. 9D is a circuit diagram of the sub-pixel of the light-emitting display device according to an exemplary embodiment of the present disclosure during the emission period in the private mode.

FIGS. 8A and 8B are waveform charts showing emission signals and scan signals in each of the share mode and the private mode of the light-emitting display device according to an exemplary embodiment of the present disclosure. FIG. 9A is a circuit diagram of the sub-pixel of the light-emitting display device according to an exemplary embodiment of the present disclosure during an initial period in each of the share mode and the private mode. FIG. 9B is a circuit diagram of the sub-pixel of the light-emitting display device according to an exemplary embodiment of the present disclosure during a sampling period in each of the share mode and the private mode. FIG. 9C is a circuit diagram of the sub-pixel of the light-emitting display device according to an exemplary embodiment of the present disclosure during an emission period in the share mode. FIG. 9D is a circuit diagram of the sub-pixel of the light-emitting display device according to an exemplary embodiment of the present disclosure during the emission period in the private mode.

Referring to FIG. 7 and FIGS. 8A, 8B together, an operation of the light-emitting display device 100 according to an exemplary embodiment of the present disclosure in each of the share mode and the private mode will be described below.

Specifically, during an initial period T1 in each of the share mode and the private mode, the N−1th scan signal Scan(N−1) is at a low level which is a turn-on level and the Nth scan signal Scan(N) is at a high level which is a turn-off level. Also, the first emission signal EM1(N) is at the high level which is a turn-off level, the second emission signal EM2(N) is at the high level which is a turn-off level, and the third emission signal EM3(N) is at the high level which is a turn-off level.

Thus, referring to FIG. 9A, during the initial period T1 in each of the share mode and the private mode, the fourth transistor T4 is turned on to apply the initial voltage Vini to the second node N2 which is the gate electrode of the first transistor T1. As a result, the gate electrode of the first transistor T1 is initialized to the initial voltage Vini.

The initial voltage Vini may be selected within a range of voltage sufficiently lower than a threshold voltage of the first transistor T1, and may be set to be equal to or lower than a low-potential driving voltage VSS.

Further, during the initial period T1 in each of the share mode and the private mode, the tenth transistor T10 is turned on to apply the reference voltage Vref to the fourth node N4. Thus, the initial voltage Vini is applied to the first electrode of the capacitor Cst, and the reference voltage Vref is applied to the second electrode of the capacitor Cst.

The reference voltage Vref may be selected within a range of voltage sufficiently lower than the threshold voltage of the first transistor T1, and may be set to be equal to or lower than the low-potential driving voltage VSS.

Further, referring to FIG. 9B, during a sampling period Ts in each of the share mode and the private mode, the N−1th scan signal Scan(N−1) is at the high level which is a turn-off level and the Nth scan signal Scan(N) is at the low level which is a turn-on level. Also, the first emission signal EM1(N) is at the high level which is a turn-off level, the second emission signal EM2(N) is at the high level which is a turn-off level, and the third emission signal EM3(N) is at the high level which is a turn-off level.

Thus, during the sampling period Ts in each of the share mode and the private mode, the second transistor T2 is turned on to apply the data voltage Vdata to the first node N1. As the third transistor T3 is also turned on, the first transistor T1 is diode-connected and the gate electrode and the drain electrode of the first transistor T1 are short-circuited so that the first transistor T1 operates like a diode.

During the sampling period Ts in each of the share mode and the private mode, a current Ids flows between the source electrode and the drain electrode of the first transistor T1. The gate electrode and the drain electrode of the first transistor T1 are in a state of diode-connection. Thus, a voltage of the second node N2 rises until a gate-source voltage Vgs of the first transistor T1 becomes the threshold voltage Vth, by the current flowing from the source electrode to the drain electrode. During the sampling period Ts, the voltage of the second node N2 is charged with a voltage Vdata+Vth corresponding to the sum of the data voltage Vdata and the threshold voltage Vth of the first transistor T1.

Further, during the sampling period Ts in each of the share mode and the private mode, the eleventh transistor T11 is turned on to apply the reference voltage Vref to the fourth node N4. Thus, the voltage Vdata+Vth corresponding to the sum of the data voltage Vdata and the threshold voltage Vth of the first transistor T1 is applied to the first electrode of the capacitor Cst. Also, the reference voltage Vref is applied to the second electrode of the capacitor Cst.

Meanwhile, the seventh transistor T7 and the ninth transistor T9 are turned on to apply the initial voltage Vini to the anode electrode of the first LED De1 and the initial voltage Vini to the anode electrode of the second LED De2. As a result, all the anode electrode of the first LED De1 and the anode electrode of the second LED De2 are initialized to the initial voltage Vini. The initial voltage Vini may be selected within a range of voltage sufficiently lower than an operating voltage of the LEDs De1 and De2, and may be set to be equal to or lower than the low-potential driving voltage VSS.

Furthermore, referring to FIG. 9C, during an emission period Te in the share mode, the N−1th scan signal Scan (N−1) is at the high level which is a turn-off level and the Nth scan signal Scan(N) is at the high level which is a turn-off level. Also, the first emission signal EM1(N) is at the low level which is a turn-on level, the second emission signal EM2(N) is at the high level which is a turn-off level, and the third emission signal EM3(N) is at the low level which is a turn-on level.

Thus, during the emission period Te in the share mode, the fifth transistor T5 is turned on to apply the high-potential driving voltage VDD to the first node N1. Also, the twelfth transistor T12 is turned on to apply the high-potential driving voltage VDD to the fourth node N4. Configured to be, a voltage of the fourth node N4 is increased from the reference voltage Vref to the high-potential driving voltage VDD. Further, the second node N2 is coupled to the fourth node N4 through the capacitor Cst, and, thus, a voltage variance VDD-Vref of the fourth node N4 is applied to the second node N2. Thus, the voltage of the second node N2 which is the gate electrode of the first transistor T1 is changed to Vdata+Vth+(VDD−Vref). Thus, the gate-source voltage Vgs of the first transistor T1 may become Vdata+Vth−Vref. Further, the eighth transistor T8 is turned on to form a current path between the third node N3 and the second LED De2. As a result, a driving current passing through the source electrode and the drain electrode of the first transistor T1 is applied to the second LED De2.

A relational expression for a driving current Ioled flowing through the second LED De2 during the emission period Te in the share mode is represented by the following Equation 1.

$$Ioled = k(Vgs - Vth)^2 = k(Vdata + Vth - Vref - Vth)^2 = k(Vdata - Vref)^2 \quad [\text{Equation 1}]$$

In Equation 1, k indicates a proportional constant determined by the electron mobility, parasitic capacitance, channel capacity, and the like of the first transistor T1.

As shown in Equation 1, according to the relational expression, any of the threshold voltage Vth component and the high-potential driving voltage VDD component of the first transistor T1 do not affect the driving current Ioled. This means that in the light-emitting display device 100 of the present disclosure, the driving current Ioled is not changed even when the threshold voltage Vth and the high-potential driving voltage VDD are changed. Configured to be, the light-emitting display device 100 according to an exemplary embodiment of the present disclosure can program the data voltage Vdata regardless of variances in the threshold voltage Vth and the high-potential driving voltage VDD.

Referring to FIG. 9D, during the emission period Te in the private mode, the N−1th scan signal Scan(N−1) is at the high level which is a turn-off level and the Nth scan signal Scan(N) is at the high level which is a turn-off level. Also, the first emission signal EM1(N) is at the low level which is a turn-on level, the second emission signal EM2(N) is at the low level which is a turn-on level, and the third emission signal EM3(N) is at the high level which is a turn-off level.

Thus, during the emission period Te in the private mode, the fifth transistor T5 is turned on to apply the high-potential driving voltage VDD to the first node N1. Further, the twelfth transistor T12 is turned on to apply the high-potential driving voltage VDD to the fourth node N4. Configured to be, the voltage of the fourth node N4 is increased from the reference voltage Vref to the high-potential driving voltage VDD. Further, the voltage of the second node N2 is changed to Vdata+Vth+(VDD−Vref) due to the coupling through the capacitor Cst described above. Thus, the gate-source voltage Vgs of the first transistor T1 may become Vdata+Vth−Vref. Further, the sixth transistor T6 is turned on to form a current path between the third node N3 and the first LED De1. As a result, a driving current passing through the source electrode and the drain electrode of the first transistor T1 is supplied to the first LED De1.

A relational expression for a driving current holed flowing through the first LED De1 during the emission period Te in the private mode is represented as in Equation 1 described above. Thus, the light-emitting display device 100 according to an exemplary embodiment of the present disclosure can program the data voltage Vdata regardless of variances in the threshold voltage Vth and the high-potential driving voltage VDD.

Hereinafter, operations of the first active area AA1 and the second active area AA2 will be described with reference to FIG. 10 and FIG. 11.

Figure 10:
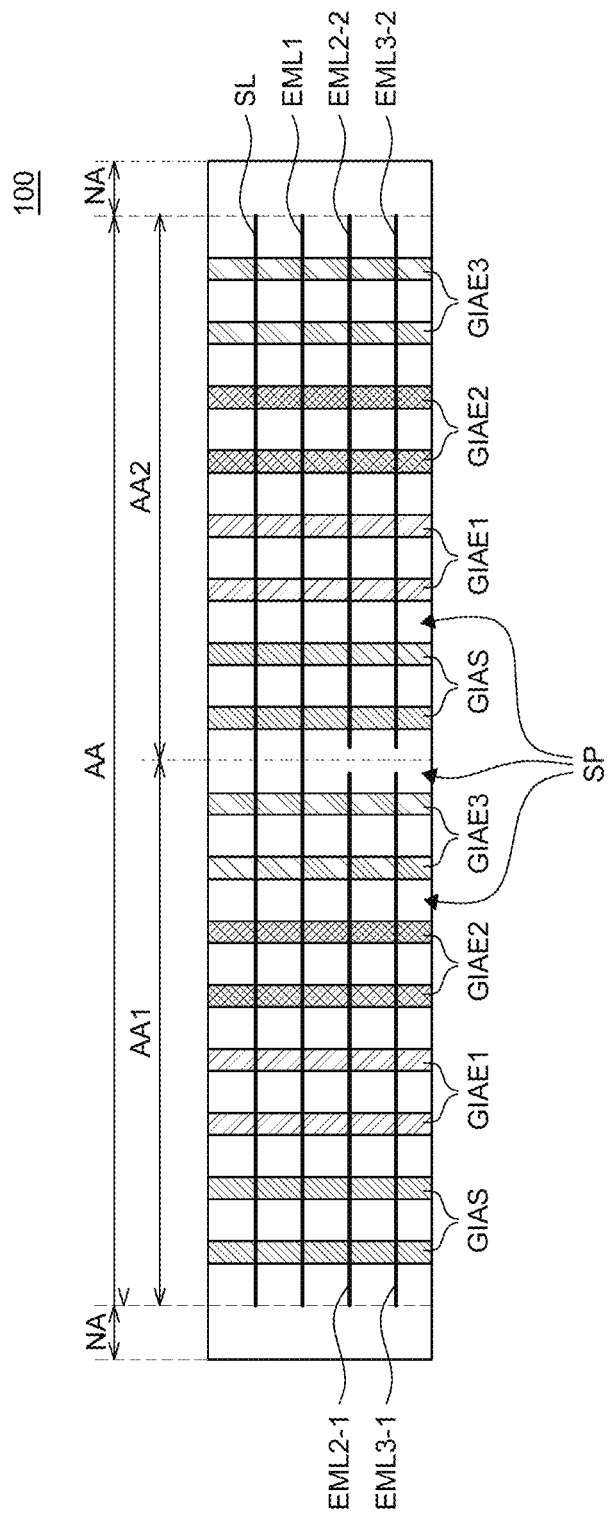
FIG. 10 is an enlarged plan view of the display panel of the light-emitting display device according to an exemplary embodiment of the present disclosure.

FIG. 10 is an enlarged plan view of the display panel of the light-emitting display device according to an exemplary embodiment of the present disclosure. FIG. 11 is a schematic enlarged plan view of the display panel operating in the share mode and the private mode. For the convenience of description, FIG. 10 and FIG. 11 enlarge and illustrate only a part of the display panel.

Referring to FIG. 10, a gate driver GD is disposed on the active area AA of the display panel PN. The gate driver GD includes a plurality of scan signal generators GIAS and a plurality of emission signal generators GIAE1, GIAE2, and GIAE3 disposed on each of the first active area AA1 and the second active area AA2. The plurality of emission signal generators GIAE1, GIAE2, and GIAE3 includes a plurality of first emission signal generators GIAE1, a plurality of second emission signal generators GIAE2, and a plurality of third emission signal generators GIAE3. The gate driver GD may be disposed between the plurality of sub-pixels SP in the active area AA. The plurality of sub-pixels SP may be disposed between the plurality of scan signal generators GIAS and each of the plurality of emission signal generators GIAE1, GIAE2, and GIAE3.

For example, in the first active area AA1, the plurality of scan signal generators GIAS connected to a plurality of scan signal lines SL and the plurality of first emission signal generators GIAE1 connected to a plurality of first emission signal lines EML1 are disposed. Also, in the first active area AA1, the plurality of second emission signal generators GIAE2 connected to a plurality of second emission signal lines EML2 and the plurality of third emission signal generators GIAE3 connected to a plurality of third emission signal lines EML3 are disposed.

Further, in the second active area AA2, the plurality of scan signal generators GIAS connected to the plurality of scan signal lines SL and the plurality of first emission signal generators GIAE1 connected to the plurality of first emission signal lines EML1 are disposed. Furthermore, in the second active area AA2, the plurality of second emission signal generators GIAE2 connected to the plurality of second emission signal lines EML2 and the plurality of third emission signal generators GIAE3 connected to the plurality of third emission signal lines EML3 are disposed.

In this case, scan signals Scan may be multi-output from the plurality of scan signal generators GIAS to each of the plurality of scan signal lines SL. A scan signal line SL may be connected to the plurality of scan signal generators GIAS. Also, scan signals Scan generated from the plurality of scan signal generators GIAS, respectively, may be simultaneously applied to the scan signal line SL. For example, a scan signal line SL may be simultaneously applied with scan signals Scan from the plurality of scan signal generators GIAS in the first active area AA1 and the plurality of scan signal generators GIAS in the second active area AA2. In this case, the scan signals Scan are simultaneously input to the scan signal line SL through many points in the scan signal line SL. Therefore, it is possible to suppress a delay of the scan signals Scan transferred through the scan signal line SL. Also, it is possible to reduce a deviation of the scan signals Scan transferred to the plurality of sub-pixels SP connected to the single scan signal line SL.

If a scan signal Scan is applied to only one of both ends of the scan signal line SL, a delay may occur while the scan signal Scan is transferred to the other end of the scan signal line SL. Thus, a delay deviation of the scan signals Scan may occur in the plurality of scan signal lines SL, which may result in degradation in display quality.

Meanwhile, as in the light-emitting display device 100 according to an exemplary embodiment of the present disclosure, the plurality of scan signal generators GIAS is formed in the active area AA and scan signals Scan are applied from many points to a scan signal line SL. Thus, it is possible to minimize a delay of the scan signals Scan.

Each of the plurality of first emission signal lines EML1 may be connected to the plurality of first emission signal generators GIAE1. Also, first emission signals EM1(N) may be multi-output from the plurality of first emission signal generators GIAE1 to each of the plurality of first emission signal lines EML1. A first emission signal line EML1 is connected to the plurality of first emission signal generators GIAE1, and first emission signals EM1(N) generated from the plurality of first emission signal generators GIAE1, respectively, may be simultaneously applied to the first emission signal line EML1. For example, the single first emission signal line EML1 may be simultaneously applied with first emission signals EM1(N) from the plurality of first emission signal generators GIAE1 in the first active area AA1 and the plurality of first emission signal generators GIAE1 in the second active area AA2. In this case, the first emission signals EM1(N) are simultaneously input to the first emission signal line EML1 through many points in the first emission signal line EML1. Therefore, it is possible to suppress a delay of the first emission signals EM1(N) transferred through the first emission signal line EML1. Also, by adjusting the position of the first emission signal generator GIAE1 connected to the first emission signal line EML1, a delay deviation of the first emission signals EM1(N) transferred to first emission signal line EML1 in the first active area AA1 and the second active area AA2 may be reduced.

Each of the plurality of second emission signal lines EML2 may be connected to the plurality of second emission signal generators GIAE2. Also, second emission signals EM2(N) may be multi-output from the plurality of second emission signal generators GIAE2 to each of the plurality of second emission signal lines EML2. Configured to be, the second emission signals EM2(N) may be simultaneously input to a second emission signal line EML2 through many points of the second emission signal line EML2. A second emission signal line EML2 is connected to the plurality of second emission signal generators GIAE2. Also, second emission signals EM2(N) generated from the plurality of second emission signal generators GIAE2, respectively, may be simultaneously applied to the second emission signal line EML2.

Each of the plurality of third emission signal lines EML3 may be connected to the plurality of third emission signal generators GIAE3. Also, third emission signals EM3(N)

may be multi-output from the plurality of third emission signal generators GIAE3 to each of the plurality of third emission signal lines EML3. Configured to be, the third emission signals EM3(N) may be simultaneously input to a third emission signal line EML3 through many points in the third emission signal line EML3. A third emission signal line EML3 is connected to the plurality of third emission signal generators GIAE3. Also, third emission signals EM3(N) generated from the plurality of third emission signal generators GIAE3, respectively, may be simultaneously applied to the third emission signal line EML3.

Meanwhile, the plurality of scan signal lines SL and the plurality of first emission signal lines EML1 continuously extend throughout the first active area AA1 and the second active area AA2. However, the plurality of second emission signal lines EML2 and the plurality of third emission signal lines EML3 are separated at the boundary between the first active area AA1 and the second active area AA2. Thus, a second emission signal line EML2 disposed in the first active area AA1 may be separated and spaced apart from a second emission signal line EML2 disposed in the second active area AA2. Also, a third emission signal line EML3 disposed in the first active area AA1 may be separated and spaced apart from a third emission signal line EML3 disposed in the second active area AA2.

For example, the plurality of second emission signal lines EML2 includes a plurality of second-first emission signal lines EML2-1 disposed in the first active area AA1 and configured to transfer second emission signals EM2(N) to sub-pixels SP in the first active area AA1. Also, the plurality of second emission signal lines EML2 includes a plurality of second-second emission signal lines EML2-2 disposed in the second active area AA2 and configured to transfer second emission signals EM2(N) to sub-pixels SP in the second active area AA2. The plurality of third emission signal lines EML3 includes a plurality of third-first emission signal lines EML3-1 disposed in the first active area AA1 and configured to transfer third emission signals EM3(N) to the sub-pixels SP in the first active area AA1. Also, the plurality of third emission signal lines EML3 includes a plurality of third-second emission signal lines EML3-2 disposed in the second active area AA2 and configured to transfer third emission signals EM3(N) to the sub-pixels SP in the second active area AA2.

In this case, second emission signals EM2(N) may be transmitted from the plurality of second emission signal generators GIAE2 disposed in the first active area AA1 to the plurality of second-first emission signal lines EML2-1. Also, second emission signals EM2(N) may be transmitted from the plurality of second emission signal generators GIAE2 disposed in the second active area AA2 to the plurality of second-second emission signal lines EML2-2. Further, third emission signals EM3(N) may be transmitted from the plurality of third emission signal generators GIAE3 disposed in the first active area AA1 to the plurality of third-first emission signal lines EML3-1. Furthermore, third emission signals EM3(N) may be transmitted from the plurality of third emission signal generators GIAE3 disposed in the second active area AA2 to the plurality of third-second emission signal lines EML3-2.

In the light-emitting display device 100 according to an exemplary embodiment of the present disclosure, the second emission signal lines EML2 and the third emission signal lines EML3 disposed in each of the first active area AA1 and the second active area AA2 are separated. Thus, the first active area AA1 and the second active area AA2 can operate independently in the share mode or the private mode. For example, while the first active area AA1 operates in the share mode, the second active area AA2 may operate in the private mode or the share mode. Also, while the second active area AA2 operates in the private mode, the first active area AA1 may operate in the private mode or the share mode.

Figure 11:
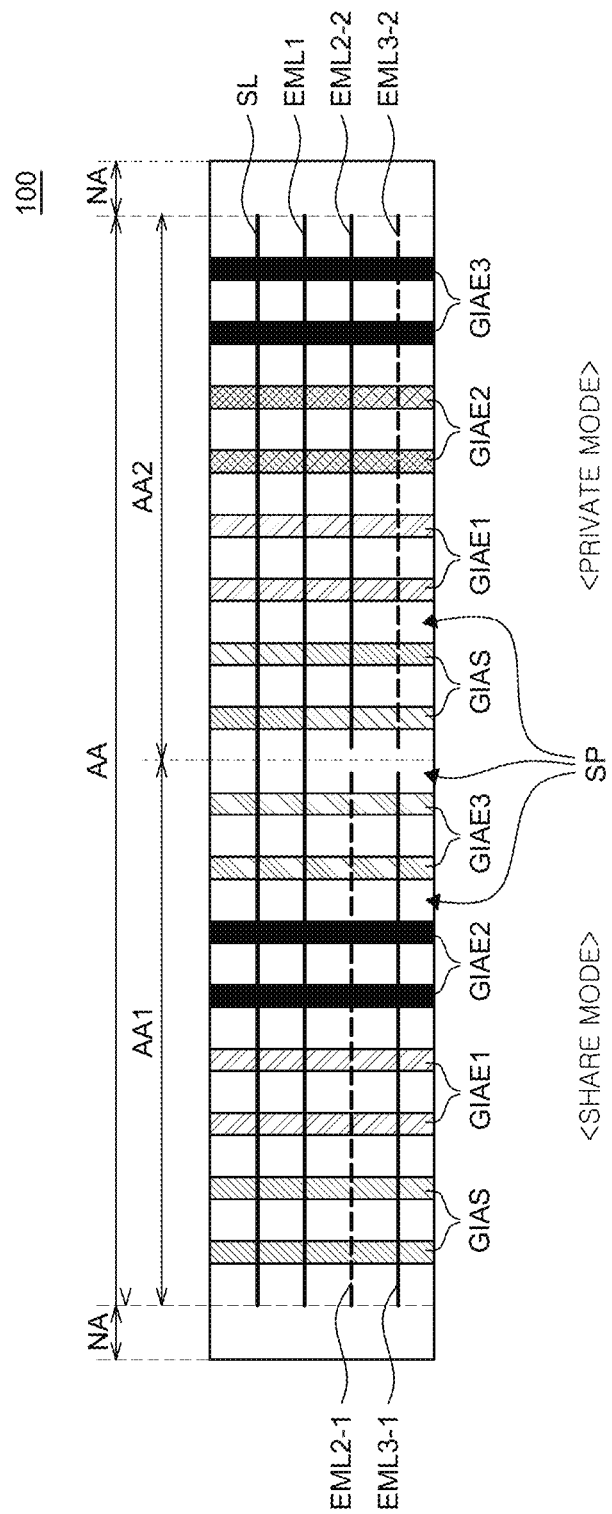
FIG. 11 is a schematic enlarged plan view of the display panel operating in the share mode and the private mode.

For example, as shown in FIG. 11, if the first active area AA1 operates in the share mode and the second active area AA2 operates in the private mode, only the third emission signal generator GIAE3 among the second emission signal generator GIAE2 and the third emission signal generator GIAE3 in the first active area AA1 can output the third emission signal EM3(N) of the low level which is a turn-on level. In this case, the sixth transistor T6 configured to form a current path between the first LED De1 and the first transistor T1 may maintain a turn-off state. Also, the eighth transistor T8 configured to form a current path between the second LED De2 and the first transistor T1 may be turned on and may transfer a driving current to the second LED De2. Configured to be, the plurality of sub-pixels SP disposed in the first active area AA1 may operate as shown in FIG. 9C during an emission period, and, thus, the first active area AA1 may operate in the share mode.

If the first active area AA1 operates in the share mode and the second active area AA2 operates in the private mode, only the second emission signal generator GIAE2 among the second emission signal generator GIAE2 and the third emission signal generator GIAE3 in the second active area AA2 can output the second emission signal EM2(N) of the low level which is a turn-on level. In this case, the sixth transistor T6 configured to form a current path between the first LED De1 and the first transistor T1 may be turned on and may transfer a driving current to the first LED De1. Also, the eighth transistor T8 configured to form a current path between the second LED De2 and the first transistor T1 may maintain a turn-off state. Configured to be, the plurality of sub-pixels SP disposed in the second active area AA2 may operate as shown in FIG. 9D during an emission period, and, thus, the second active area AA2 may operate in the private mode.

In this case, even when the third emission signal generator GIAE3 in the first active area AA1 outputs the third emission signal EM3(N) of the low level, the third emission signal EM3(N) of the low level is not transferred to the second active area AA2. This is because the third-first emission signal line EML3-1 in the first active area AA1 is separated from the third-second emission signal line EML3-2 in the second active area AA2. Also, when the second emission signal generator GIAE2 in the second active area AA2 outputs the second emission signal EM2(N) of the low level, the second emission signal EM2(N) of the low level is not transferred to the first active area AA1. This is because the second-first emission signal line EML2-1 in the first active area AA1 is separated from the second-second emission signal line EML2-2 in the second active area AA2. Therefore, the plurality of second emission signal generators GIAE2 and the plurality of third emission signal generators GIAE3 are disposed in each of the first active area AA1 and the second active area AA2. Also, the plurality of second emission signal lines EML2 and the plurality of third emission signal lines EML3 disposed in the first active area AA1 and the second active area AA2 are separated. Thus, it is possible to independently operate the first active area AA1 and the second active area AA2 in the share mode and the private mode.

For another example, if the first active area AA1 operates in the private mode and the second active area AA2 operates in the share mode, the gate driver GD may output emission signals EM2(N) and EM3(N) of the low level which is a turn-on level only to the second-first emission signal line EML2-1 in the first active area AA1 and the third-second emission signal line EML3-2 in the second active area AA2.

For yet another example, if both the first active area AA1 and the second active area AA2 operate in the share mode, the gate driver GD may output emission signals EM2(N) and EM3(N) of the low level which is a turn-on level only to the second-second emission signal line EML2-2 in the first active area AA1 and the third-second emission signal line EML3-2 in the second active area AA2.

For still another example, if both the first active area AA1 and the second active area AA2 operate in the private mode, the gate driver GD may output emission signals EM2(N) and EM3(N) of the low level which is a turn-on level only to the second-first emission signal line EML2-1 in the first active area AA1 and the third-first emission signal line EML3-1 in the second active area AA2.

Therefore, in the light-emitting display device 100 according to an exemplary embodiment of the present disclosure, the second emission signal line EML2 and the third emission signal line EML3 disposed in the first active area AA1 and the second active area AA2 are separated. Also, the second emission signal generator GIAE2 is formed in each of the separated second emission signal lines EML2, and the third emission signal generator GIAE3 is formed in each of the separated third emission signal lines EML3. Thus, it is possible to independently control the share mode and the private mode of the first active area AA1 and the second active area AA2. Since the second emission signal line EML2 in the first active area AA1 is separated from the second emission signal line EML2 in the second active area AA2, the second active area AA2 may operate in the private mode regardless of a mode of the first active area AA1. Also, the first active area AA1 may operate in the private mode regardless of a mode of the second active area AA2. Since the third emission signal line EML3 in the first active area AA1 is separated from the third emission signal line EML3 in the second active area AA2, the second active area AA2 may operate in the share mode regardless of a mode of the first active area AA1. Also, the first active area AA1 may operate in the share mode regardless of a mode of the second active area AA2. Therefore, in the light-emitting display device 100 according to an exemplary embodiment of the present disclosure, a specific area of the screen may be selectively switched to any one of the share mode and the private mode.

In the light-emitting display device 100 according to an exemplary embodiment of the present disclosure, the plurality of scan signal generators GIAS and the plurality of emission signal generators GIAE1, GIAE2, and GIAE3 are disposed in the active area AA. Thus, it is possible to suppress a delay of signals transferred to each of a plurality of lines. For example, scan signals Scan from the plurality of scan signal generators GIAS may be simultaneously applied to a scan signal line SL. Configured to be, the scan signals Scan may be multi-output to the single scan signal line SL. Since the scan signals Scan are applied to the single scan signal line SL through many points, a delay of the scan signals Scan transferred to the entire scan signal line SL can be suppressed. Therefore, in the light-emitting display device 100 according to an exemplary embodiment of the present disclosure, the plurality of scan signal generators GIAS is connected to each of the plurality of scan signal lines SL. Also, the plurality of emission signal generators GIAE1, GIAE2, and GIAE3 is connected to each of the plurality of emission signal lines EML1, EML2, and EML3. Thus, it is possible to suppress a delay of scan signals Scan and emission signals transferred to the plurality of sub-pixels SP and reduce a consequent deviation.

In the light-emitting display device 100 according to an exemplary embodiment of the present disclosure, the gate driver GD is disposed on the active area AA. Thus, it is possible to reduce the size of the non-active area NA, e.g., the size of a bezel. Since the gate driver GD is disposed inside the active area AA, a part of the non-active area NA where the gate driver GD is conventionally disposed can be removed. Thus, the size of the non-active area NA can be reduced.

Figure 12:
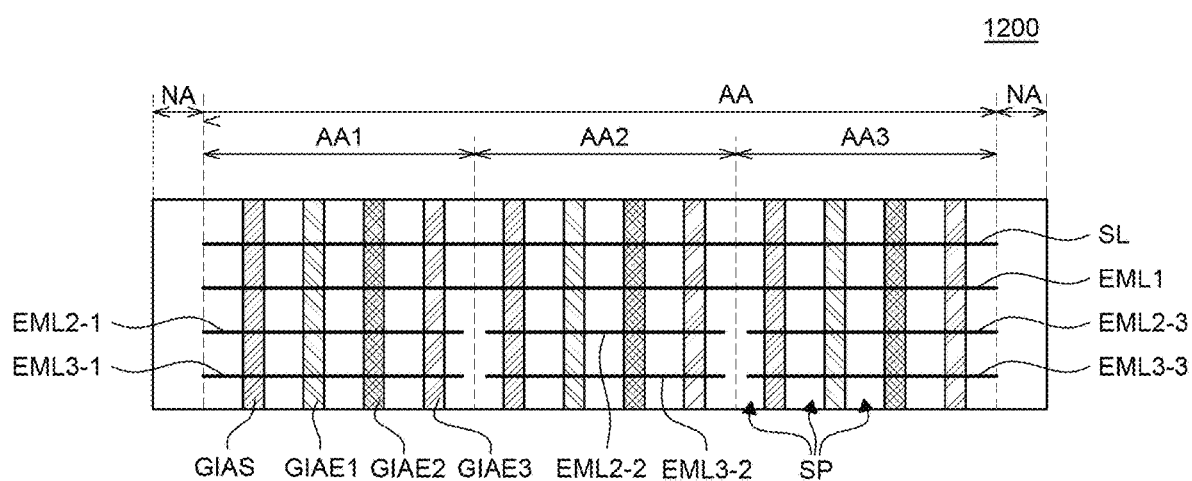
FIG. 12 is a schematic enlarged plan view of a display panel of a light-emitting display device according to another exemplary embodiment of the present disclosure.

FIG. 12 is a schematic enlarged plan view of a display panel of a light-emitting display device according to another exemplary embodiment of the present disclosure. A light-emitting display device 1200 shown in FIG. 12 is substantially the same as the light-emitting display device 100 shown in FIG. 1 through FIG. 11 except the active area AA, the gate driver GD, the second emission signal line EML2, and the third emission signal line EML3. Therefore, a redundant description will be omitted.

Referring to FIG. 12, the active area AA includes the first active area AA1, the second active area AA2, and a third active area AA3. The first active area AA1, the second active area AA2, and the third active area AA3 are sequentially disposed.

The gate driver GD is disposed in each of the first active area AA1, the second active area AA2, and the third active area AA3. One or more scan signal generators GIAS and one or more emission signal generators GIAE1, GIAE2, and GIAE3 are disposed in each of the first active area AA1, the second active area AA2 and the third active area AA3.

The scan signal line SL and the first emission signal line EML1 extending across the entire active area AA are disposed. The single scan signal line SL and the first emission signal line EML1 may be connected to sub-pixels SP disposed in the first active area AA1, the second active area AA2, and the third active area AA3. Configured to be, the first active area AA1, the second active area AA2, and the third active area AA3 share the scan signal line SL and the first emission signal line EML1, respectively.

The plurality of second emission signal lines EML2 and the plurality of third emission signal lines EML3 are disposed in each of the first active area AA1, the second active area AA2, and the third active area AA3. The plurality of second emission signal lines EML2 and the plurality of third emission signal lines EML3 corresponding to each of the first active area AA1, the second active area AA2, and the third active area AA3 are separated from each other. The plurality of second emission signal lines EML2 and the plurality of third emission signal lines EML3 may be separated at the boundary between the first active area AA1 and the second active area AA2 and at the boundary between the second active area AA2 and the third active area AA3.

Specifically, the plurality of second emission signal lines EML2 includes the second-first emission signal line EML2-1 connected to a sub-pixel SP and the second emission signal generator GIAE2 in the first active area AA1. Also, the plurality of second emission signal lines EML2 includes the second-second emission signal line EML2-2 connected to a sub-pixel SP and the second emission signal generator GIAE2 in the second active area AA2. Further, the plurality of second emission signal lines EML2 includes a second-third emission signal line EML2-3 connected to a sub-pixel SP and the second emission signal generator GIAE2 in the third active area AA3. The second-first emission signal line EML2-1, the second-second emission signal line EML2-2, and the second-third emission signal line EML2-3 are not connected to each other, but separated from each other.

The plurality of third emission signal lines EML3 includes the third-first emission signal line EML3-1 connected to a sub-pixel SP and the third emission signal generator GIAE3 in the first active area AA1. Also, the plurality of third emission signal lines EML3 includes the third-second emission signal line EML3-2 connected to a sub-pixel SP and the third emission signal generator GIAE3 in the second active area AA2. Further, the plurality of third emission signal lines EML3 includes a third-third emission signal line EML3-3 connected to a sub-pixel SP and the third emission signal generator GIAE3 in the third active area AA3. The third-first emission signal line EML3-1, the third-second emission signal line EML3-2, and the third-third emission signal line EML3-3 are not connected to each other, but separated from each other.

Therefore, it is possible to apply the second emission signal EM2(N) and the third emission signal EM3(N) of different levels to the sub-pixels SP in the first active area AA1, the second active area AA2, and the third active area AA3, respectively. In this case, each of the first active area AA1, the second active area AA2, and the third active area AA3 may operate in any one of the share mode and the private mode. For example, the second emission signal EM2(N) of the high level and the third emission signal EM3(N) of the low level may be applied to the first active area AA1 to operate the first active area AA1 in the share mode. At the same time, the second emission signal EM2(N) of the low level and the third emission signal EM3(N) of the high level may be applied to the second active area AA2 and the third active area AA3 to operate the second active area AA2 and the third active area AA3 in the private mode.

Therefore, in the light-emitting display device 1200 according to another exemplary embodiment of the present disclosure, the active area AA may be divided into a plurality of active areas. Also, each of the plurality of active areas may operate independently in any one of the share mode and the private mode. Herein, the number of divided active areas AA may vary depending on design choice. The design of the gate driver GD, the second emission signal lines EML2, and the third emission signal lines EML3 may also be changed corresponding to the design of the active area AA.

The exemplary embodiments of the present disclosure can also be described as follows:

According to an aspect of the present disclosure, the light-emitting display device includes a display panel in which a plurality of active areas including a first active area and a second active area is defined. Also, the light-emitting display device includes a plurality of sub-pixels disposed in each of the plurality of active areas, and a gate driver disposed on the plurality of active areas. Each of the plurality of sub-pixels includes a first light-emitting diode (LED) that emits light in response to a driving current and a first lens that refracts the light emitted from the first LED. Also, each of the plurality of sub-pixels includes a second LED that emits light in response to the driving current and a second lens that refracts the light emitted from the second LED and has a different shape from the first lens. Therefore, according to the present disclosure, the light-emitting display device can operate in any one of a private mode and a share mode by using the first lens and the second lens.

The first lens may be a half-spherical lens, and the second lens may be a half-cylindrical lens.

Each of the plurality of active areas may operate independently in any one of a private mode and a share mode, and in the private mode, the first LED may emit light and the light emitted from the first LED may be output with a viewing angle limited by the first lens in a first direction and a second direction, and in the share mode, the second LED may emit light and the light emitted from the second LED may be output with the viewing angle limited by the second lens only in the first direction. The viewing angle of the second lens is different and in most cases larger than the viewing angle of the first lens.

Each of the plurality of sub-pixels may operate in a period divided into an initial period, a sampling period, and an emission period, and during the emission period, the driving current may be supplied to the first LED or the second LED.

Each of the plurality of sub-pixels may further include a driving transistor configured to control the driving current, a first emission control transistor configured to be connected between the driving transistor and the first LED and transfers the driving current to the first LED and a second emission control transistor configured to be connected between the driving transistor and the second LED and transfers the driving current to the second LED, and in the private mode, the first emission control transistor may be turned on and the second emission control transistor may be turned off, and in the share mode, the first emission control transistor may be turned off and the second emission control transistor may be turned on.

The light-emitting display device may further comprise an emission signal line that transmits an emission signal to a gate electrode of the first emission control transistor, and the emission signal line in the first active area may be separated from the emission signal line in the second active area.

The gate driver may include a plurality of emission signal generators disposed on each of the first active area and the second active area and outputs the emission signal to the emission signal lines in the first active area and the second active area, respectively, and one of the emission signal lines is applied with a plurality of emission signals output from the plurality of emission signal generators.

The light-emitting display device may further comprise an emission signal line that transmits an emission signal to a gate electrode of the second emission control transistor, and the emission signal line in the first active area may be spaced apart from the emission signal line in the second active area.

A plurality of emission signal generators disposed on each of the first active area and the second active area and outputs the emission signal to the emission signal lines in the first active area and the second active area, respectively, and the emission signals output from the plurality of emission signal generators disposed on the first active area are transmitted only to the emission signal line in the first active area, and the emission signals output from the plurality of emission signal generators disposed on the second active area may be transmitted only to the emission signal line in the second active area.

According to another aspect of the present disclosure, the light-emitting display device includes a display panel in which an active area including a first active area and a second active area is defined. Also, the light-emitting display device includes a plurality of sub-pixels disposed in each of the first active area and the second active area, and a gate driver disposed on the first active area and the second active area. Each of the plurality of sub-pixels includes a first LED that emits light in response to a driving current in a private mode. Also, each of the plurality of sub-pixels includes a half-spherical lens that refracts the light emitted from the first LED and limits a viewing angle in a first direction and a second direction. Further, each of the plurality of sub-pixels includes a second LED that emits light in response to the driving current in a share mode. Furthermore, each of the plurality of sub-pixels includes a half-cylindrical lens that refracts light emitted from the second LED and limits the viewing angle only in the first direction. Therefore, according to the present disclosure, each of the first active area and the second active area can operate independently in any one of the private mode and the share mode.

Each of the plurality of sub-pixels may further include a first transistor configured to control the driving current and includes a source electrode connected to a first node, a gate electrode connected to a second node, and a drain electrode connected to a third node, a second transistor configured to supply a data voltage to the first node, a third transistor that diode-connects the gate electrode and the drain electrode of the first transistor, a fourth transistor configured to supply an initial voltage to the gate electrode of the first transistor, a fifth transistor configured to supply a high-potential driving voltage to the first node, a sixth transistor configured to form a current path between the first transistor and the first LED, a seventh transistor configured to supply the initial voltage to an anode electrode of the first LED, an eighth transistor configured to form a current path between the first transistor and the second LED, a ninth transistor configured to supply the initial voltage to an anode electrode of the second LED, a capacitor whose one end is connected to the second node and the other end is connected to a fourth node, a tenth transistor and an eleventh transistor configured to supply a reference voltage to the fourth node; and a twelfth transistor configured to supply the high-potential driving voltage to the fourth node.

The display panel may further include a first emission signal line configured to supply a first emission signal to a gate electrode of the fifth transistor and a gate electrode of the twelfth transistor in each of the plurality of sub-pixels, a second emission signal line configured to supply a second emission signal to a gate electrode of the sixth transistor in each of the plurality of sub-pixels and a third emission signal line configured to supply a third emission signal to a gate electrode of the eighth transistor in each of the plurality of sub-pixels.

The gate driver may include a plurality of first emission signal generators that outputs the first emission signal to the first emission signal line, a plurality of second emission signal generators that outputs the second emission signal to the second emission signal line and a plurality of third emission signal generators that outputs the third emission signal to the third emission signal line.

The second emission signal line may include a second-first emission signal line connected to the plurality of sub-pixels in the first active area and a second-second emission signal line connected to the plurality of sub-pixels in the second active area, and some of the plurality of second emission signal generators output the second emission signal to the second-first emission signal line, and some others output the second emission signal to the second-second emission signal line.

The third emission signal line includes a third-first emission signal line connected to the plurality of sub-pixels in the first active area and a third-second emission signal line connected to the plurality of sub-pixels in the second active area, and some of the plurality of third emission signal generators output the third emission signal to the third-first emission signal line, and some others output the third emission signal to the third-second emission signal line.

If the first active area operates in the share mode and the second active area operates in the private mode, the gate driver may output the second emission signal of a turn-on level and the third emission signal of a turn-on level to the second-second emission signal line and the third-first emission signal line.

If the first active area operates in the private mode and the second active area operates in the share mode, the gate driver may output the second emission signal of a turn-on level and the third emission signal of a turn-on level to the second-first emission signal line and the third-second emission signal line.

If the first active area and the second active area may operate in the share mode, the gate driver outputs the second emission signal of a turn-on level and the third emission signal of a turn-on level to the second-second emission signal line and the third-second emission signal line, and If the first active area and the second active area operate in the private mode, the gate driver may output the second emission signal of a turn-on level and the third emission signal of a turn-on level to the second-first emission signal line and the third-first emission signal line.

The active area may further include a third active area, and the second emission signal line further includes a second-third emission signal line connected to the plurality of sub-pixels in the third active area, and the third emission signal line further includes a third-third emission signal line connected to the plurality of sub-pixels in the third active area, and still some others of the plurality of second emission signal generators output the second emission signal to the second-third emission signal line, and still some others of the plurality of third emission signal generators output the third emission signal to the third-third emission signal line.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting display device, comprising:
   a display panel in which a plurality of active areas including a first active area and a second active area is defined;
   a plurality of sub-pixels disposed in each of the plurality of active areas; and
   a gate driver disposed on the plurality of active areas,
   wherein each sub-pixel of the plurality of sub-pixels includes:
      a first light-emitting diode (LED) that emits light in response to a driving current;
      a first lens that refracts the light emitted from the first LED;
      a second LED that emits light in response to the driving current; and
      a second lens that refracts the light emitted from the second LED and has a different shape from the first lens,
   wherein each sub-pixel includes the first lens and the second lens that is disposed side-by-side on a same layer,
   wherein each of the plurality of active areas operates independently in any one of a private mode and a share mode,
   wherein, in the private mode, the first LED emits light and the light emitted from the first LED is output with a viewing angle limited by the first lens in a first direction and a second direction transverse to the first direction, and
   wherein, in the share mode, the second LED emits light and the light emitted from the second LED is output with the viewing angle limited by the second lens only in the first direction.

2. The light-emitting display device according to claim 1, wherein the first lens includes a half-spherical lens, and wherein the second lens includes a half-cylindrical lens.

3. The light-emitting display device according to claim 1, wherein each of the plurality of sub-pixels operates in a period divided into an initial period, a sampling period, and an emission period, and
   wherein, during the emission period, the driving current is supplied to the first LED or the second LED.

4. The light-emitting display device according to claim 3, wherein each of the plurality of sub-pixels further includes:
   a driving transistor configured to control the driving current;
   a first emission control transistor configured to be electrically connected between the driving transistor and the first LED and transfer the driving current to the first LED; and
   a second emission control transistor configured to be electrically connected between the driving transistor and the second LED and transfer the driving current to the second LED,
   wherein in the private mode, the first emission control transistor is turned on and the second emission control transistor is turned off, and
   wherein in the share mode, the first emission control transistor is turned off and the second emission control transistor is turned on.

5. The light-emitting display device according to claim 4, further comprising:
   an emission signal line that transmits an emission signal to a gate electrode of the first emission control transistor,
   wherein the emission signal line in the first active area is separated from the emission signal line in the second active area.

6. The light-emitting display device according to claim 5, wherein the gate driver includes:
   a plurality of emission signal generators disposed on each of the first active area and the second active area and outputs the emission signal to the emission signal lines in the first active area and the second active area, respectively, and
   one of the emission signal lines is applied with a plurality of emission signals output from the plurality of emission signal generators.

7. The light-emitting display device according to claim 4, further comprising:
   an emission signal line that transmits an emission signal to a gate electrode of the second emission control transistor,
   wherein the emission signal line in the first active area is spaced apart from the emission signal line in the second active area.

8. The light-emitting display device according to claim 7, wherein the gate driver includes:
   a plurality of emission signal generators disposed on each of the first active area and the second active area and outputs the emission signal to the emission signal lines in the first active area and the second active area, respectively, and
   wherein the emission signals output from the plurality of emission signal generators disposed on the first active area are transmitted only to the emission signal line in the first active area, and
   wherein the emission signals output from the plurality of emission signal generators disposed on the second active area are transmitted only to the emission signal line in the second active area.

9. A light-emitting display device, comprising:
   a display panel in which an active area including a first active area and a second active area is defined;
   a plurality of sub-pixels disposed in each of the first active area and the second active area; and
   a gate driver disposed on the first active area and the second active area,
   wherein each of the plurality of sub-pixels includes:
      a first LED that emits light in response to a driving current in a private mode;
      a half-spherical lens that refracts the light emitted from the first LED and limits a viewing angle in a first direction and a second direction transverse to the first direction;
      a second LED that emits light in response to the driving current in a share mode; and
      a half-cylindrical lens that refracts the light emitted from the second LED and limits the viewing angle only in the first direction.

10. The light-emitting display device of claim 9, wherein the first direction includes a vertical direction including an up direction and a down direction, and
    wherein the second direction includes a horizontal direction including a right direction and a left direction.

11. The light-emitting display device according to claim 9, wherein each of the plurality of sub-pixels further includes:

a first transistor configured to control the driving current and includes a source electrode electrically connected to a first node, a gate electrode electrically connected to a second node, and a drain electrode electrically connected to a third node;
a second transistor configured to supply a data voltage to the first node;
a third transistor configured to diode-connect the gate electrode and the drain electrode of the first transistor;
a fourth transistor configured to supply an initial voltage to the gate electrode of the first transistor;
a fifth transistor configured to supply a high-potential driving voltage to the first node;
a sixth transistor configured to form a current path between the first transistor and the first LED;
a seventh transistor configured to supply the initial voltage to an anode electrode of the first LED;
an eighth transistor configured to form a current path between the first transistor and the second LED;
a ninth transistor configured to supply the initial voltage to an anode electrode of the second LED;
a capacitor whose one end is electrically connected to the second node and the other end is electrically connected to a fourth node;
a tenth transistor and an eleventh transistor configured to supply a reference voltage to the fourth node; and
a twelfth transistor configured to supply the high-potential driving voltage to the fourth node.

12. The light-emitting display device according to claim 11,
wherein the display panel further includes:
a first emission signal line configured to supply a first emission signal to a gate electrode of the fifth transistor and a gate electrode of the twelfth transistor in each of the plurality of sub-pixels;
a second emission signal line configured to supply a second emission signal to a gate electrode of the sixth transistor in each of the plurality of sub-pixels; and
a third emission signal line configured to supply a third emission signal to a gate electrode of the eighth transistor in each of the plurality of sub-pixels.

13. The light-emitting display device according to claim 11,
wherein the gate driver includes:
a plurality of first emission signal generators that outputs the first emission signal to the first emission signal line;
a plurality of second emission signal generators that outputs the second emission signal to the second emission signal line; and
a plurality of third emission signal generators that outputs the third emission signal to the third emission signal line.

14. The light-emitting display device according to claim 12,
wherein the second emission signal line includes a second-first emission signal line electrically connected to the plurality of sub-pixels in the first active area and a second-second emission signal line electrically connected to the plurality of sub-pixels in the second active area, and
wherein some of the plurality of second emission signal generators output the second emission signal to the second-first emission signal line, and some others output the second emission signal to the second-second emission signal line.

15. The light-emitting display device according to claim 13,
wherein the third emission signal line includes a third-first emission signal line electrically connected to the plurality of sub-pixels in the first active area and a third-second emission signal line electrically connected to the plurality of sub-pixels in the second active area, and
wherein some of the plurality of third emission signal generators output the third emission signal to the third-first emission signal line, and some others output the third emission signal to the third-second emission signal line.

16. The light-emitting display device according to claim 14,
wherein if the first active area operates in the share mode and the second active area operates in the private mode, the gate driver outputs the second emission signal of a turn-on level and the third emission signal of a turn-on level to the second-second emission signal line and the third-first emission signal line.

17. The light-emitting display device according to claim 14,
wherein if the first active area operates in the private mode and the second active area operates in the share mode, the gate driver outputs the second emission signal of a turn-on level and the third emission signal of a turn-on level to the second-first emission signal line and the third-second emission signal line.

18. The light-emitting display device according to claim 14,
wherein if the first active area and the second active area operate in the share mode, the gate driver outputs the second emission signal of a turn-on level and the third emission signal of a turn-on level to the second-second emission signal line and the third-second emission signal line, and
wherein if the first active area and the second active area operate in the private mode, the gate driver outputs the second emission signal of a turn-on level and the third emission signal of a turn-on level to the second-first emission signal line and the third-first emission signal line.

19. The light-emitting display device according to claim 14,
wherein the active area further includes a third active area,
wherein the second emission signal line further includes a second-third emission signal line electrically connected to the plurality of sub-pixels in the third active area,
wherein the third emission signal line further includes a third-third emission signal line electrically connected to the plurality of sub-pixels in the third active area, and
wherein still some others of the plurality of second emission signal generators output the second emission signal to the second-third emission signal line, and still some others of the plurality of third emission signal generators output the third emission signal to the third-third emission signal line.

20. A light-emitting display device, comprising:
a display panel having a plurality of sub-pixels, the display panel configured to display an image, the image output by the display panel having a viewing angle, the display panel configured to selectively operate in a private mode using a first lens or a share mode using a second lens that adjusts the viewing angle in one or more directions relative to the viewing angle of the first lens;
a first emission area of a subpixel within the display panel disposed below the first lens; and
a second emission area of the subpixel within the display panel disposed below the second lens,
wherein the viewing angle is limited to first value in a left direction and a right direction during the private mode,
wherein the viewing angle is larger than the first value in the left direction and the right direction during the share mode,
wherein each sub-pixel of the plurality of sub-pixels includes the first lens and the second lens that is disposed side-by-side on a same layer, and
wherein, in the share mode, the first emission area is turned off and the second emission area is turned on.

21. The light-emitting display device of claim 20, wherein the viewing angle is limited in an up direction and a down direction by the second lens during the share mode.

22. The light-emitting display device of claim 20, wherein, in the private mode, the first emission area is turned on and the second emission area is turned off.

23. The light-emitting display device of claim 20, wherein the viewing angle is limited in an up direction and a down direction by the first lens during the private mode.

24. The light-emitting display device of claim 20, wherein a degree of the viewing angle limited in the left direction is different from a degree of the viewing angle limited in the right direction during the private mode.

25. The light-emitting display device of claim 20, wherein the first lens include a half-spherical lens and the second lens include a half-cylindrical lens, and
wherein the first lens at least partially overlaps with the first emission area and the second lens at least partially overlaps with the second emission area.

* * * * *